(12) United States Patent
Ichinose et al.

(10) Patent No.: US 8,685,854 B2
(45) Date of Patent: Apr. 1, 2014

(54) METHOD OF FORMING A VIA IN A SEMICONDUCTOR DEVICE

(75) Inventors: Kazuhito Ichinose, Kawasaki-shi (JP); Kotaro Kihara, Kawasaki-shi (JP); Tatsunori Murata, Kawasaki-shi (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 248 days.

(21) Appl. No.: 13/046,331

(22) Filed: Mar. 11, 2011

(65) Prior Publication Data

US 2011/0221063 A1 Sep. 15, 2011

(30) Foreign Application Priority Data

Mar. 12, 2010 (JP) ................................. 2010-055698

(51) Int. Cl.
*H01L 21/44* (2006.01)
(52) U.S. Cl.
USPC .................... 438/672; 438/653; 257/E21.584
(58) Field of Classification Search
USPC ........................... 257/E21.586; 438/653, 672
See application file for complete search history.

(56) References Cited

U.S. PATENT DOCUMENTS

| 6,809,421 | B1 | 10/2004 | Hayasaka et al. |
| 7,517,798 | B2 * | 4/2009 | Tuttle ............................ 438/667 |
| 7,964,502 | B2 * | 6/2011 | Dao et al. ...................... 438/667 |
| 2005/0014311 | A1 | 1/2005 | Hayasaka et al. |
| 2006/0006539 | A1 | 1/2006 | Matsui et al. |

FOREIGN PATENT DOCUMENTS

| JP | 2006-19431 | 1/2006 |
| JP | 2006-41450 | 2/2006 |
| JP | 2007-49103 | 2/2007 |

* cited by examiner

*Primary Examiner* — Howard Weiss
(74) *Attorney, Agent, or Firm* — Womble Carlyle

(57) ABSTRACT

A process for burying a tungsten member into a blind hole formed in a wafer, in which blind hole a through via is to be made. Film-formation (for forming the tungsten member) is carried out to position, at the periphery of the wafer, the outer circumference of the tungsten member inside the outer circumference of a barrier metal beneath the tungsten film. This process makes it possible to bury the tungsten member, which may be relatively thin, into the blind hole, which may be relatively large, so as to decrease a warp of the wafer and further prevent an underlying layer beneath the tungsten member from being peeled at the periphery of the wafer.

12 Claims, 19 Drawing Sheets

METHOD OF FORMING A VIA IN A SEMICONDUCTOR DEVICE

CROSS-REFERENCE TO RELATED APPLICATIONS

The disclosure of Japanese Patent Application No. 2010-55698 filed on Mar. 12, 2010 including the specification, drawings and abstract is incorporated herein by reference in its entirety.

BACKGROUND OF THE INVENTION

The present invention relates to a technique that is effectively applicable to a through electrode technique in a manufacturing method of a semiconductor device.

DESCRIPTION OF RELATED ART

Japanese Unexamined Patent Publication No. 2007-201512 (Patent document 1), or US Patent Application Publication No. 2005-014311 (Patent document 2), which is a counterpart thereof, discloses the following example as a technique for forming a through plug, which is penetrated through a silicon substrate or the like: a technique wherein: in the state that an insulating film containing a silicon nitride film and some other film is laid on the front surface of a wafer and on some other region, a tungsten film or the like is formed into deep holes and over the whole of the front surface of the wafer by CVD (chemical vapor deposition) or some other method; the silicon nitride film is used as a stopper film to perform CMP (chemical mechanical polishing) or the like, thereby burying tungsten plugs into the deep holes; and then the rear surface of the wafer is subjected to CMP to make the tungsten plugs exposed, thereby forming through plugs.

Japanese Unexamined Patent Publication No. 2007-49103 (Patent document 3) and Japanese Unexamined Patent Publication No. 2006-41450 (Patent document 4) each disclose a technique in which in the state that an insulating film such as a silicon nitride film is laid on the rear surface of a wafer and inside through holes in the wafer, a tungsten film or the like is formed inside the through holes and on the whole of the rear surface of the wafer by CVD or some other method, thereby forming through plugs.

Japanese Unexamined Patent Publication No. 2006-19431 (Patent document 5) or US Patent Application Publication No. 2006-6539 (Patent document 6), which is a counterpart thereof, discloses the following example as a technique for forming a through plug, which is penetrated through a silicon substrate or the like, in a stripe form: a technique wherein: in the state that an insulating film containing a silicon nitride film is laid on the front surface of a wafer and on some other region, a tungsten film or the like is formed inside a deep hole in a trench form and on the whole of the front surface of the wafer by CVD or some other method; by CMP or the like, a stripe-form tungsten plug is buried into the trench-form deep hole; and then the rear surface of the wafer is also subjected to CMP to make the stripe-form tungsten plug exposed, thereby forming a stripe-form through plug.

PRIOR ART DOCUMENTS

Patent Documents

Patent document 1: Japanese Unexamined Patent Publication No. 2007-201512

Patent document 2: US Patent Application Publication No. 2005-014311

Patent document 3: Japanese Unexamined Patent Publication No. 2007-49103

Patent document 4: Japanese Unexamined Patent Publication No. 2006-41450

Patent document 5: Japanese Unexamined Patent Publication No. 2006-19431

Patent document 6: US Patent Application Publication No. 2006-6539

SUMMARY OF THE INVENTION

In connection with three-dimensional packaging and others in LSI (large scale integration), the technique for forming through electrodes (through-hole electrodes), which are penetrated through a semiconductor substrate such as a silicon substrate, has been becoming important. At the present, the Bosch process is the main technique for through-electrode forming. However, this process is a very expensive process since dry etching and film-formation are repeated many times.

Thus, the inventors have investigated a possibility of through-electrode-forming technique using ordinary dry etching. As a result, it has been made evident that the following problem remains: as a through electrode metal buried into a deep hole having an aspect ratio of 20 or more, which is to be a through hole, tungsten, which is good in burying property, is used in many cases; deep holes in a wafer made by ordinary dry etching become larger in size than holes made by the Bosch process (and each have a sectional shape having a size of at least 4 µm); and in order to bury a tungsten film into the deep holes, which are relatively large, in the wafer, the film thickness of this film to be formed on the front surface of the wafer also inevitably becomes large so that a warp of the wafer increases over a limit below which the process can be normally carried out. Even when the warp does not exceed this limit, below which this problem is not caused over a permissible level, there are caused problems including a problem that when the tungsten film is deposited over the wafer, the layer beneath the tungsten film is peeled at the periphery of the wafer.

A typical aspect of the invention disclosed by the present application is briefly as follows:

One aspect of the invention concerns a method used at time of burying a tungsten member into a blind hole (i.e., a hole which does not pas through the entire thickness of the item in which it is formed, sometimes called a "non-through hole") formed in a wafer, in which through hole a through via is to be made In the method, film-formation (for forming the tungsten member) is carried out such that, at the periphery of the wafer, the outer circumference of the tungsten member is inside the outer circumference of a barrier metal film beneath the tungsten film. The barrier metal film may be TiN.

One advantage of this method is that by limiting the outer circumference of the tungsten member to be inside the outer circumference of a barrier metal beneath the tungsten film, the peeling of the barrier metal film can be prevented.

DETAILED DESCRIPTION OF THE PREFERRED EMBODIMENTS

Figure 1:
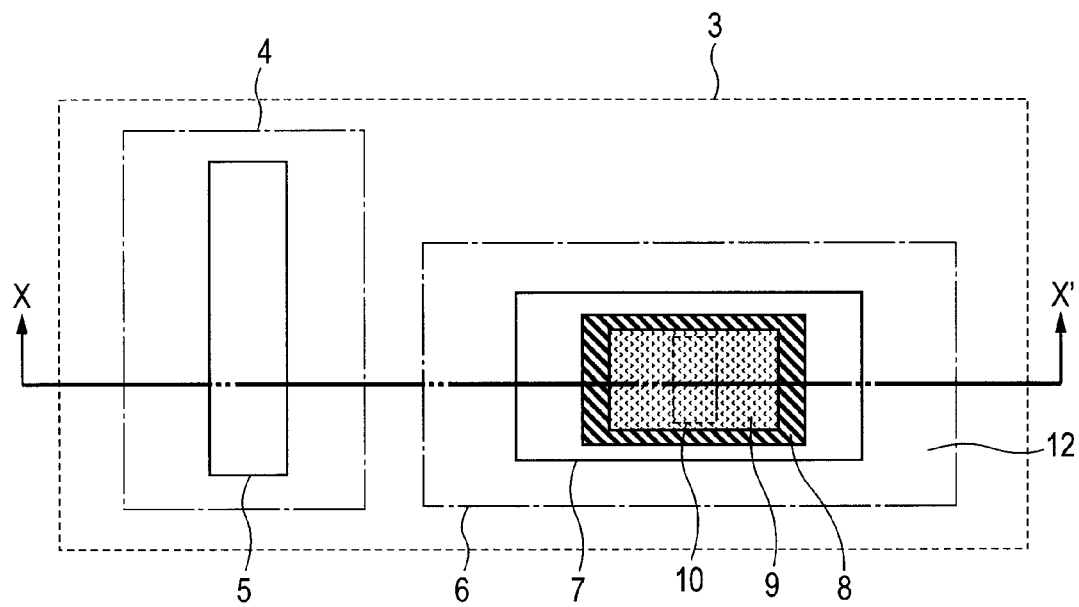
FIG. 1 is a top view of a portion (including a through-via-forming region and a SiGe device region) of a semiconductor chip region of a wafer (just after a blind hole in which a through via is to be formed is made), this region being a region to which an embodiment (embodiment 1 through a via middle process) of the semiconductor device manufacturing method of the invention is applied.

First, typical embodiments of the invention disclosed by the application are summarized with reference to the following items.

Item 1. A manufacturing method of a semiconductor device, comprises the steps of: (a) making a blind hole in a silicon wafer from a device main surface thereof toward the rear surface thereof; (b) after the step (a), forming a silicon nitride film over the device main surface of the silicon wafer; (c) after the step (b), forming a barrier metal film, by CVD, over the silicon nitride film over the device main surface, the periphery of the silicon wafer at the device main surface side of the wafer, and the inner surface of the blind hole; (d) forming a tungsten film, by CVD, over the barrier metal film over the device main surface except in the vicinity of the outer edge of the barrier metal film, and over the barrier metal film inside the blind hole so as to be buried into the blind hole; (e) removing the barrier metal film and the tungsten film outside the blind hole at the device main surface side of the silicon wafer; and (f) subjecting the rear surface side of the silicon wafer to film-thinning treatment, thereby making the blind hole into a through via, the barrier metal film being exposed in the periphery of the silicon wafer when the step (d) is ended.

Item 2. The manufacturing method of a semiconductor device according to item 1, further comprising, between the steps (a) and (b), a step of: (g) forming an ozone TEOS film over the device main surface of the silicon wafer and the inner surface of the blind hole by thermal CVD.

Item 3. The manufacturing method of a semiconductor device according to item 1 or 2, wherein the silicon nitride film is formed by plasma CVD.

Item 4. The manufacturing method of a semiconductor device according to any one of items 1 to 3, wherein the step (d) comprises the following substeps of: (d1) forming a first tungsten film having a first thickness over the barrier metal film over the device main surface, and over the barrier metal film inside the blind hole; and (d2) after the substep (d1), forming a second tungsten film having a second thickness larger than the first thickness over the first tungsten film, the vicinity of the outer edge of the first tungsten film being exposed when the substep (d2) is ended.

Item 5. The manufacturing method of a semiconductor device according to item 4, wherein the substep (d1) is performed by atomic layer deposition (ALD).

Item 6. The manufacturing method of a semiconductor device according to item 4 or 5, wherein the temperature for processing the wafer in the substep (d2) is 550° C. or higher and 600° C. or lower.

Item 7. The manufacturing method of a semiconductor device according to any one of items 4 to 6, wherein among the individual processing gas pressures in the step (c), and the substeps (d1) and (d2), the gas pressure in the step (c) is the lowest and the gas pressure in the substep (d2) is the highest.

Item 8. The manufacturing method of a semiconductor device according to any one of items 1 to 7, wherein the steps (a) to (f) are performed after a device is formed in a device region at the device main surface side of the wafer, and before the wafer is caused to undergo a BEOL process.

Item 9. The manufacturing method of a semiconductor device according to any one of items 1 to 7, wherein the steps (a) to (f) are performed after a premetal insulating film is formed in a device region at the device main surface side of the wafer.

Item 10. The manufacturing method of a semiconductor device according to any one of items 1 to 9, wherein the direction of stress of the silicon nitride film is a direction in which stress of the tungsten film is cancelled.

Item 11. The manufacturing method of a semiconductor device according to any one of items 1 to 10, further comprising, between the steps (e) and (f), a following step of: (i) removing the silicon nitride film outside the blind hole at the device main surface side of the wafer.

Item 12. A manufacturing method of a semiconductor device, comprising the steps of: (a) making a blind hole in a silicon wafer from a device main surface thereof toward the rear surface thereof; (b) after the step (a), forming a silicon nitride film over the device main surface of the silicon wafer; (c) after the step (b), forming a barrier metal film over the silicon nitride film over the device main surface, the periphery of the silicon wafer at the device main surface side of the wafer, and the inner surface of the blind hole; (d) forming a tungsten film over the barrier metal film over the device main surface, and over the barrier metal inside the blind hole so as to be buried into the blind hole; (e) removing the barrier metal film and the tungsten film outside the blind hole at the device main surface side of the silicon wafer; and (f) subjecting the rear surface side of the silicon wafer to film-thinning treatment, thereby making the blind hole into a through via, the direction of stress of the silicon nitride film being a direction in which stress of the tungsten film is cancelled.

Item 13. The manufacturing method of a semiconductor device according to item 12, wherein the step (d) comprises the following substeps of: (d1) forming a first tungsten film having a first thickness over the barrier metal film over the device main surface, and over the barrier metal film inside the blind hole; and (d2) after the substep (d1), forming a second tungsten film having a second thickness larger than the first thickness over the first tungsten film, the vicinity of the outer edge of the first tungsten film being exposed when the substep (d2) is ended.

Item 14. The manufacturing method of a semiconductor device according to item 12 or 13, further comprising, between the steps (e) and (f), a following step of: (g) removing the silicon nitride film outside the blind hole at the device main surface side of the wafer.

Item 15. The manufacturing method of a semiconductor device according to item 13 or 14, wherein the substep (d1) is performed by atomic layer deposition (ALD).

Item 16. The manufacturing method of a semiconductor device according to any one of items 13 to 15, wherein the temperature for processing the wafer in the substep (d2) is 550° C. or higher and 600° C. or lower.

Item 17. The manufacturing method of a semiconductor device according to any one of items 13 to 16, wherein among the individual processing gas pressures in the step (c), and the substeps (d1) and (d2), the gas pressure in the step (c) is the lowest and the gas pressure in the substep (d2) is the highest.

Item 18. The manufacturing method of a semiconductor device according to any one of items 12 to 17, wherein the steps (a) to (f) are performed before a device is formed in a device region at the device main surface side of the wafer.

Item 19. The manufacturing method of a semiconductor device according to any one of items 12 to 17, wherein the steps (a) to (f) are performed after a device is formed in a device region at the device main surface side of the wafer, and before the wafer is caused to undergo a BEOL process.

Item 20. A manufacturing method of a semiconductor device, comprising the steps of: (a) making a blind hole in a silicon wafer from a device main surface thereof toward the rear surface thereof; (b) after the step (a), forming a ozone TEOS film over the device main surface of the silicon wafer and the inner surface of the blind hole by thermal CVD; (c) after the step (b), forming a silicon nitride film over the ozone TEOS film over the device main surface of the silicon wafer by plasma CVD; (d) after the step (c), forming a barrier metal film over the silicon nitride film over the device main surface, the periphery of the silicon wafer at the device main surface side of the wafer, and the inner surface of the blind hole; (e) forming a tungsten film over the barrier metal film over the device main surface, and over the barrier metal inside the blind hole so as to be buried into the blind hole; (f) removing the barrier metal film and the tungsten film outside the blind hole at the device main surface side of the silicon wafer; and (g) subjecting the rear surface side of the silicon wafer to film-thinning treatment, thereby making the blind hole into a through via.

Item 21. The manufacturing method of a semiconductor device according to item 20, wherein the step (e) comprises the following substeps of: (e1) forming a first tungsten film having a first thickness over the barrier metal film over the device main surface, and over the barrier metal film inside the blind hole; and (e2) forming a second tungsten film having a second thickness larger than the first thickness over the first tungsten film over the first tungsten film and in a first tungsten film region other than in the vicinity of the outer edge of the first tungsten film.

Item 22. The manufacturing method of a semiconductor device according to item 20 or 21, further comprising, between the steps (f) and (g), a following step of: (h) removing the silicon nitride film outside the blind hole at the device main surface side of the wafer.

Item 23. The manufacturing method of a semiconductor device according to item 21 or 22, wherein the substep (e1) is performed by atomic layer deposition (ALD).

Item 24. The manufacturing method of a semiconductor device according to any one of items 21 to 23, wherein the temperature for processing the wafer in the substep (e2) is 550° C. or higher and 600° C. or lower.

Item 25. The manufacturing method of a semiconductor device according to any one of items 21 to 24, wherein among the individual processing gas pressures in the step (d), and the substeps (e1) and (e2), the gas pressure in the step (d) is the lowest and the gas pressure in the substep (e2) is the highest.

Item 26. The manufacturing method of a semiconductor device according to any one of items 20 to 25, wherein the steps (a) to (g) are performed before a device is formed in a device region at the device main surface side of the wafer.

Item 27. The manufacturing method of a semiconductor device according to any one of items 20 to 25, wherein the steps (a) to (g) are performed after a premetal insulating film is formed in a device region at the device main surface side of the wafer, and further before the wafer is caused to undergo a BEOL process.

[Explanation of the Description Manner, Basic Terms, and Format in (the Specification and/or Claims of) the Present Application]

1. In the present application, for the sake of convenience, any embodiment may be divided into plural sections as the need arises, so as to be described in accordance with the sections. However, these are not independent of each other; thus, these may be individual sections of a single example, or one thereof may be details of a part of the other(s) or may be a modification of a part or the whole of the other(s) except any case where it is evidently stated that such a matter is denied. In principle, about the same members or portions, repeated description is omitted. Each of the constituent elements in any embodiment is not essential except in any case where it is stated that this is the case, any case to which this matter is theoretically not applicable, and any case where this matter is clearly interpreted to be improper from the context.

The wording "semiconductor device" or "semiconductor integrated circuit device" in the application refers mainly to one or more transistors (active elements), alone, that may be of various types; or a device wherein around one or more transistors as a center, one or more components, such as one or more resistances and one or more condensers, are integrated in, on or over a semiconductor chip (such as a monocrystal silicon substrate). Typical examples of the transistor(s), which may be of various types, include MISFETs (metal insulator semiconductor field effect transistors), typical examples thereof including MOSFETs (metal oxide semiconductor field effect transistors). Typical examples of the integrated circuit in this case include CMIS (complementary metal insulator semiconductor) integrated circuits, typical examples thereof including CMOS (complementary metal oxide semiconductor) integrated circuits, in each of which an N channel type MISFET and a P channel type MISFET are combined with each other.

Usually, the wafer process for the present-day semiconductor large scale integrated circuits (LSIs) can be roughly classified into the FEOL (front-end-of-line) process, which extends from the carrying-in of a silicon wafer as a starting material to a premetal step (including the formation of an interlayer dielectric between the lower end of an M1 (see below in this paragraph) wiring layer and a gate electrode structure, the formation of a contact hole, and the burying of a tungsten plug) or a step close to the premetal step; and the BEOL (back-end-of-line) process, which extends from the formation of the M1 wiring layer as a starting operation to the creation of a pad opening in a final passivation film on an aluminum based pad electrode, or an operation close to the creation (the BEOL process also includes wafer level packaging in a case where the wafer process includes a wafer level packaging step). In the FEOL process, the step of patterning a gate electrode, the step of making a contact hole, and others are fine processing steps, wherein especially fine processing is required. In the BEOL process, especially fine processing is required in the step of making a via and a trench, in particular, in the formation of local wirings of relatively lower layers (specifically, about a buried wiring structure comprised of about 4 layers, the formation of fine buried wirings from an M1 to an M3 or thereabout; and about a buried wiring structure comprised of about 10 layers, the formation of fine buried wirings from an M1 to an M5 or thereabout), or the formation of some other layered structure. The symbol "MN" wherein N is usually from 1 to 15 or thereabout represents a wiring of the $N^{th}$ layer from below. Thus, M1 represents a wiring of the first layer from below.

2. In connection with any material, any composition or the like in the description of embodiments and others, in the case of using the wording "X comprising A, or X made of A" or the like, a matter that an element other than A is contained as one out of principal constituent elements is not excluded except any case where it is evidently stated that this matter is denied, and any case where this matter is clearly interpreted to be improper from the context in the same manner as described above. For example, the above-mentioned wording has a meaning that "X contains A as a principal component", or some other meaning. It is needless to say that, for example, the wording "silicon member" is not limited to a member consisting of pure silicon, and includes, in the category thereof, a member containing SiGe alloy or some other multi-component alloy containing silicon as a principal component, and a member containing not only Si but also other additives. In the same manner, it is needless to say that the wording "silicon oxide film" or "silicon oxide insulating film" includes, in the category thereof, an undoped silicon dioxide film, which is relatively pure, an FSG (fluorosilicate glass) film, a TEOS based silicon oxide film, a SiOC (silicon oxycarbide) film, a carbon-doped silicon oxide film, thermal oxide films such as ODG (organosilicate glass), PSG (phosphorous silicate glass) and BPSG (borophosphosilicate glass) films, a CVD oxide film, painted silicon oxide films such as SOG (spin-on-glass) and nano-clustering silica (NCS) films, a silica based low-k insulating film (porous insulating film), wherein pores are incorporated into any one of the same films as described above, and a composite film wherein any one of the above-mentioned films, as a principle element, is combined with a different silicon based insulating film.

An example of the silicon based insulating film used ordinarily in the field of semiconductors is, besides the silicon oxide based insulating film, a silicon nitride based insulating film. Examples of the material of this film include SiN, SiCN, SiNH, and SiCH. The wording "silicon nitride" includes, in the category thereof, both of SiN and SiNH except any case in which it is evidently stated that this matter is denied. Similarly, the expression "SiCN" includes, in the category thereof, both of SiCN and SiCNH except any case in which it is evidently stated that this matter is denied.

For reference, SiC has a nature similar to that of SiN. However, SiON is classified into silicon oxide rather than silicon nitride in many cases.

A silicon nitride film is frequently used as an etching stopper film in SAC (self-aligned contact) technique. In addition, the film is used also as a stress-imparting film in SMT (stress memorization technique).

Similarly, the wording "nickel silicide" usually denotes nickel monosilicide. However, the wording includes, in the category thereof, not only relatively pure nickel silicide but also any alloy, mixed crystal or other material containing, as a main constituent element, nickel monosilicide. Moreover, silicide is not limited to nickel silicide, and may also denote cobalt silicide, titanium silicide, tungsten silicide or the like, which has been hitherto used to give a good result. Examples of a metal film usable to be made into a silicide include, besides a Ni (nickel) film, nickel alloy films such as a Ni—Pt alloy film (alloy film comprised of Ni and Pt), a Ni—V alloy film (alloy film comprised of Ni and V), a Ni—Pd alloy film (alloy film comprised of Ni and Pd), a Ni—Yb alloy film (alloy film comprised of Ni and Yb) and a Ni—Er alloy film (alloy film comprised of Ni and Er). Such silicides, which contain nickel as a main metal element, are generically called "nickel based silicide".

3. In the same manner, about forms or shapes, positions, attributes and others, preferred examples thereof will be described or illustrated by sentences or figures. However, it is needless to say that the form, shape, position and others of any article, component or portion described or illustrated are not strictly limited to the preferred examples except any case where it is evidently stated that this matter is denied, and any case where this matter is clearly interpreted to be improper from the context.

4. When a specific numerical value or quantity is referred to in connection with, e.g., any component, part or physical property, numerical values or quantities over or below the specific numerical value or quantity are allowable except any case where it is evidently stated that this matter is denied, any case where the number of the component or the like is theoretically limited to the specific numerical value or quantity, and any case where this matter is clearly interpreted to be improper from the context.

5. The wording "wafer" usually denotes a monocrystal silicon wafer over which a semiconductor integrated circuit device, which may be referred to as a semiconductor device or an electronic device, is to be formed. However, it is needless to say that the wording includes, in the category thereof, an epitaxial wafer, and a composite wafer containing an insulated substrate plus a semiconductor layer or the like, such as an SOI substrate or an LCD glass substrate.

Details of Embodiments

Embodiments of the invention will be described in more detail. In the individual drawings (referred to in order to make the description), to components or parts identical or equivalent to each other are attached identical or equivalent symbols or reference numbers, and any repeated description thereabout is in principle omitted.

Even when some region in any one of the attached drawings is a sectional cross, the addition of hatching to the region may be omitted when the addition may make the understanding of the drawing difficult or the region is evidently distinguished from an empty space. In connection therewith, even about a two-dimensionally closed opening, a border line thereof in the background may be omitted in a case where the omission is evident from description thereabout or from some other, or in other cases. Furthermore, even when a region is not a sectional cross, hatching may be added thereto in order to make it clear that the region is not any empty space.

1. Description of a Manufacturing Method of a Semiconductor Device According to an Embodiment (Embodiment 1 Through a Via Middle Process) of the Present Invention, and Others (with Reference Mainly to FIG. 1 to FIG. 19, and FIG. 27):

For the convenience of the description, in this embodiment, a specific description is made about an example in which a devise structure of a device region 6 is a SiGe-HBT (heterobipolar transistor) wherein a silicide layer other than nickel based layers (for example, a cobalt silicide layer) is mainly used, or some other structure. However, the present invention may be applied, substantially as it is, to a semiconductor having a CMOS or CMIS structure wherein a silicide layer other than nickel based layers is used. Any via middle process is characterized in that the formation of through electrodes is started at a time near to the time when the formation of a premetal insulating film is finished between FEOL and BEOL processes.

FIG. 1 to FIG. 19, and FIG. 27 are concerned with embodiment 1. With reference to these figures, the semiconductor device manufacturing method of this embodiment (via-middle-manner embodiment 1) of the invention, and so on are described in the state that the subject to be described is divided into plural sections as described below. The description in this section, S1, is partially applied to each of Sections 2 and 3 described later.

Hereinafter, an example is specifically described wherein a p-type monocrystal silicon wafer having a diameter of 300 mm (and having an initial thickness of, for example, about 885 µm) is used as a semiconductor wafer. However, use may be made of a wafer having a different diameter (such as a wafer having a diameter of 450, 200, 150 or 100 mm), a wafer of a different conductive-type (such as an n-type monocrystal silicon wafer), a wafer having a different structure (such as an epitaxial wafer or an SOI wafer), or a wafer made of a different material (such as a SiC wafer, a GaAs wafer or a GaN wafer).

Figure 2:
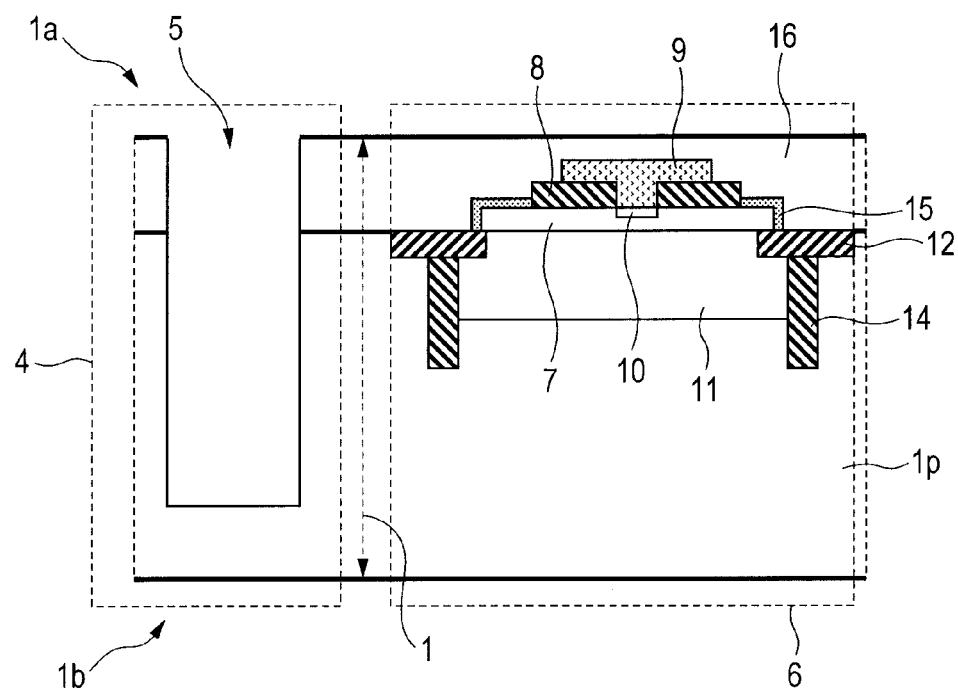
FIG. 2 is a sectional view taken along line X-X' in FIG. 1.

(1) Description of Steps from the Creation of a Blind Hole to the Formation of a Via/Plug Region (with Reference Mainly to FIGS. 1 to 11, and FIG. 27):

With reference to FIG. 1, and FIG. 2 (sectional view taken along line X-X' in FIG. 1), a description is first made about a two-dimensional layout of a partial region 3 of a chip region for a SiGe-HBT which is an example of a target device (manufactured by the method of the invention). As illustrated in FIGS. 1 and 2, in a silicon wafer 1, a SiGe—HBT region, as a device region 6, and a through-via-forming region 4 near the region 6 are formed at a device surface 1a side of the wafer 1 (i.e., at a silicon wafer side opposite to a rear surface 1b of the wafer 1); the region 4 is a region in which a through electrode for linking the region 6 and the rear surface of the (wafer) substrate to each other is to be formed. Inside the SiGe-HBT region 6, a SiGe—HBT is formed, and this SiGe—HBT is formed at the device surface 1a side of a p-type monocrystal silicon substrate region 1p and near the device surface 1a, and is separated from the surround thereof by an STI (shallow trench isolation) region and a DTI (deep trench isolation) region. On a collector region 11 surrounded by these isolation regions, an epitaxial base region 7 is located. On the upper surface thereof and at the center of the surface is an emitter impurity region 10 surrounded by a base/emitter-insulating film 8. On the emitter impurity region 10 and the base/emitter-insulating film 8, a polysilicon emitter electrode 9 is arranged. On an exposed surface region of the epitaxial base region 7, a surface silicide film 15 (cobalt silicide film) is formed. Furthermore, substantially the whole of the device surface 1a of the p-type monocrystal silicon substrate region 1p is covered with a premetal insulating film 16, which is mainly a silicon oxide based insulating film.

As illustrated in FIG. 2, in this state, a blind hole 5 is made in the through-via-forming region 4 from the device surface 1a side of the silicon wafer (semiconductor wafer) 1. The size thereof is about 10 µm in width (the corresponding size in Section 2 or 3 below is about 5 µm; the blind hole targeted in any one of the sections 1-3 is mainly a relatively wide hole, the minimum size of which is about 4 µm or more). An example of the blind hole is a hole having a length of about 50 µm and a depth of 125 µm.

Figure 3:
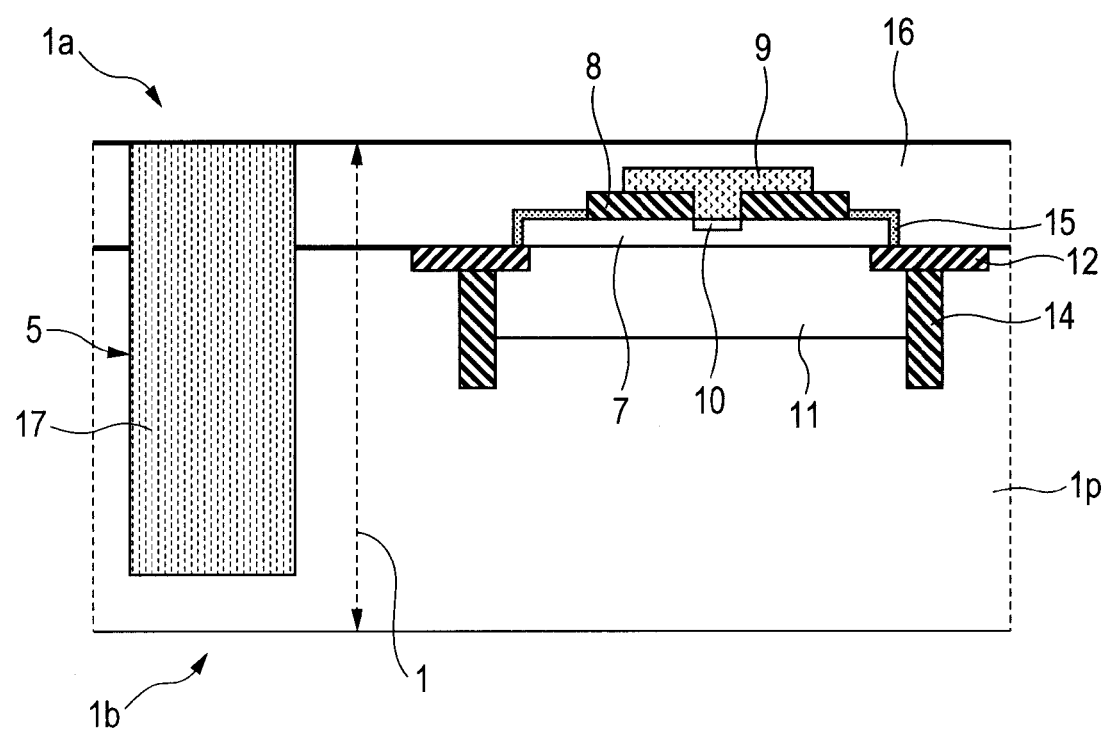
FIG. 3 corresponds to the sectional view illustrated in FIG. 2 when a via/plug region is formed.

As illustrated in FIG. 3, next, an insulator or metallic member is buried into the blind hole 5 to form a via/plug region 17. With reference to FIGS. 4 to 11, the process from the step illustrated in FIG. 2 to that illustrated in FIG. 3 is described in detail hereinafter.

Figure 4:
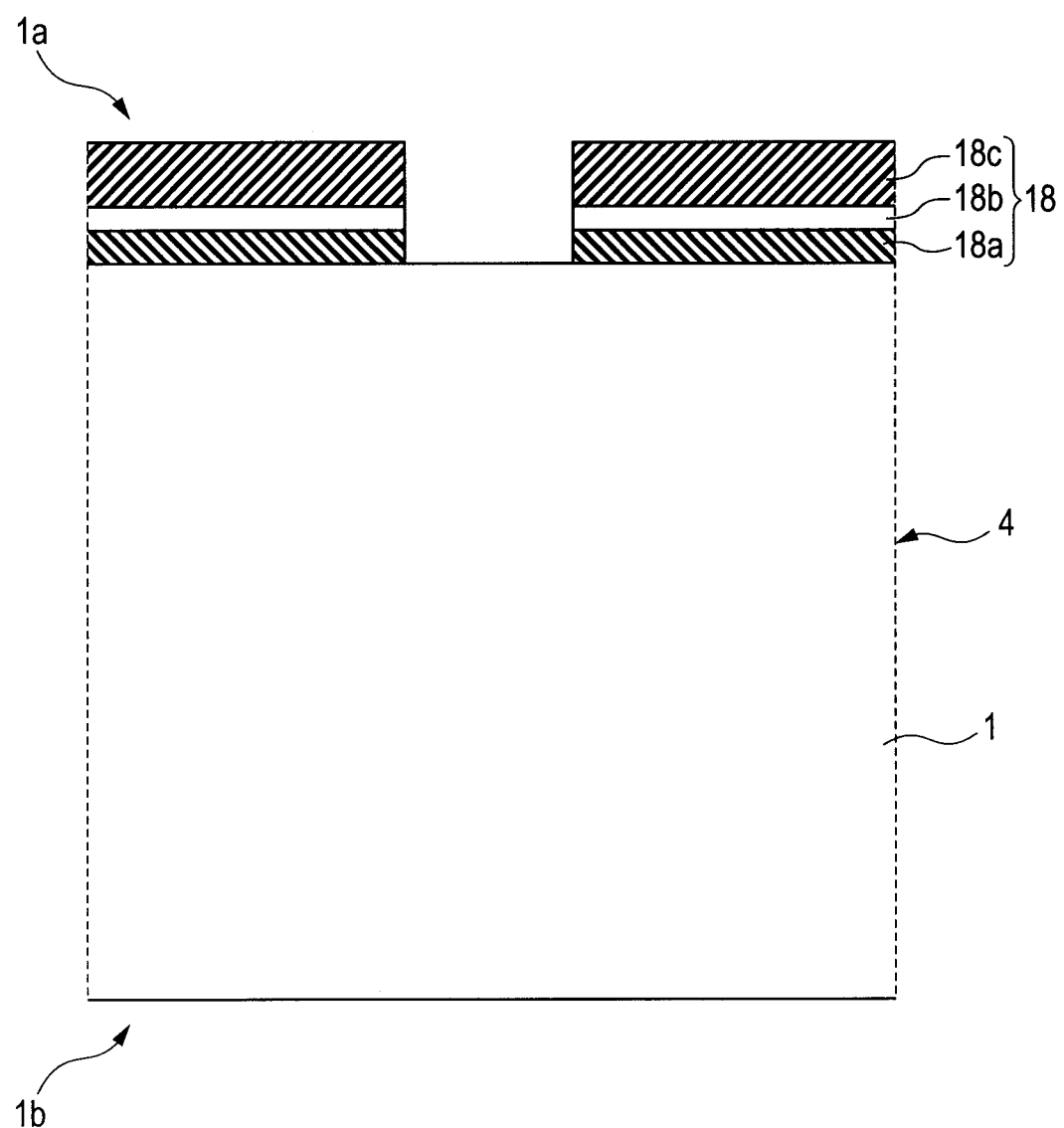
FIG. 4 is a sectional view illustrating the through-via-forming region, inside the cross section illustrated in FIG. 2, in a step in the process from a time before the creation of the blind hole to the formation of the via/plug region, this step being the step of patterning a blind-hole-working hard mask film in the method of the invention.

As illustrated in FIG. 4, an ordinary lithography is first used to pattern a blind-hole-working hard mask film 18 (comprised of a blind-hole-working silicon oxide lower film 18a, a blind-hole-working amorphous silicon film 18b, and a blind-hole-working silicon oxide upper film 18c).

Figure 5:
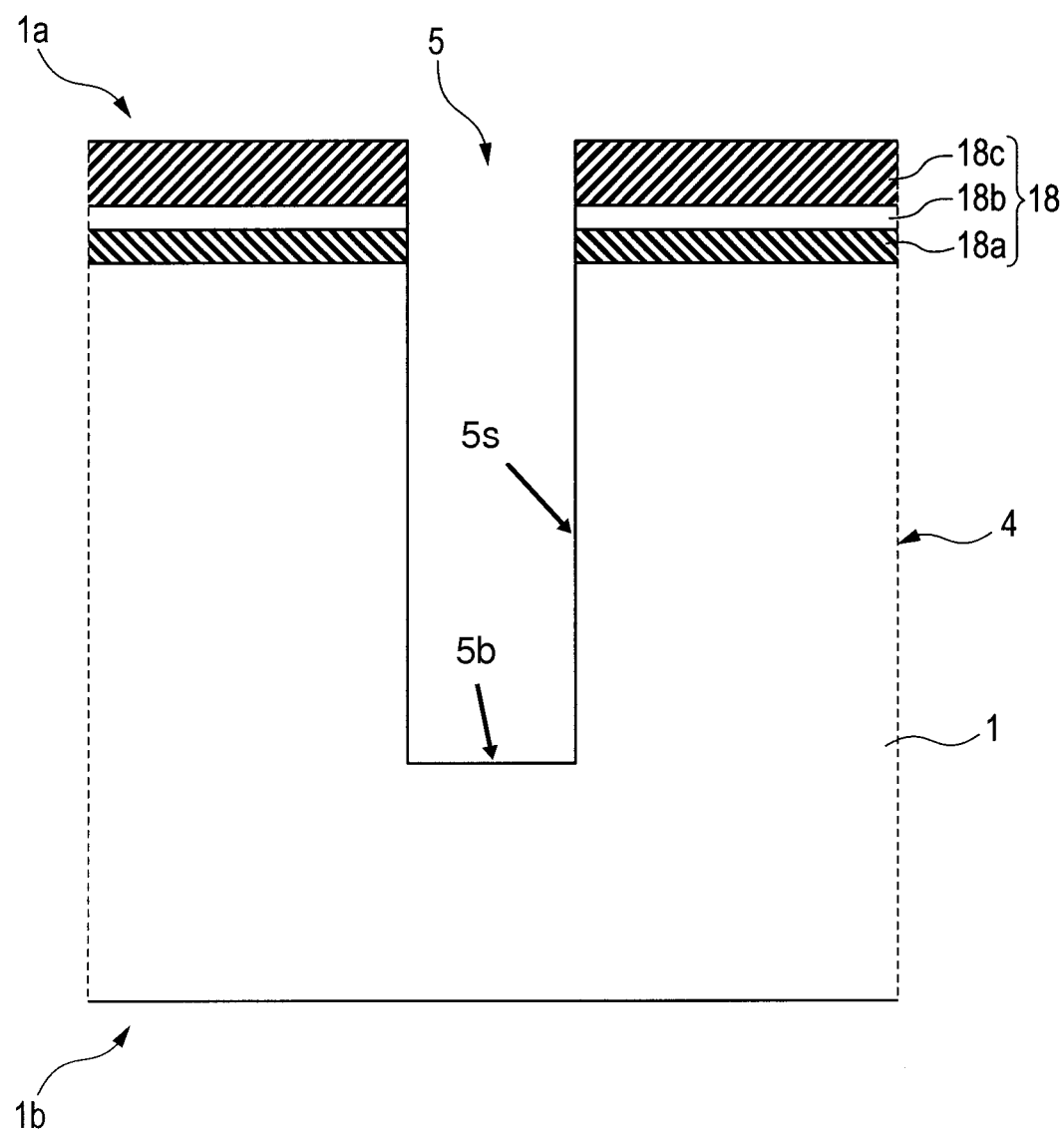
FIG. 5 illustrates the result of forming the blind hole in the device of FIG. 4.

As illustrated in FIG. 5, next, a blind hole 5 is made by anisotropic dry etching. As seen in FIG. 1, the blind hole 5 may have a rectangular footprint in a top view of the via region 4; as seen in FIG. 5, the blind hole may have a rectangular cross-section in a cross-sectional view of the via region 4. The blind hole 5 has a bottom wall 5b and a pair of opposing side walls 5s. It is understood that the depictions of the blind hole 5 are idealized and that a real blind hole may not have a perfectly flat bottom wall 5s and perfectly vertical and flat side walls 5s as seen in the figures.

Figure 6:
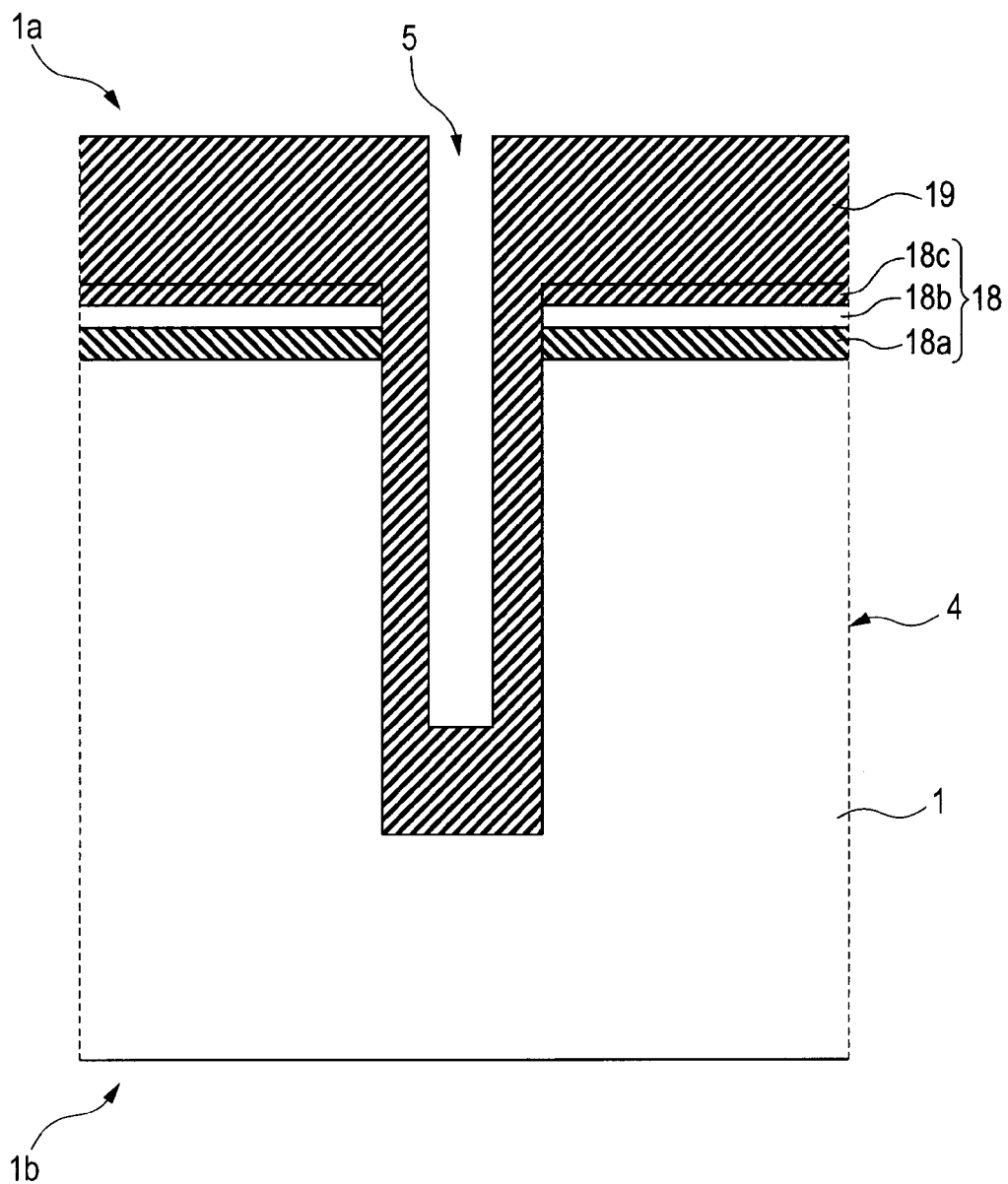
FIG. 6 illustrates the result of forming an ozone TEOS film in the device of FIG. 5.

As illustrated in FIG. 6, next, a relatively thick ozone TEOS (tetraethyl ortho-silicate) silicon oxide film 19 or the like is formed onto substantially the whole of the device surface 1a of the silicon wafer 1 by thermal CVD (chemical vapor deposition) of a single wafer processing type. An example of conditions for forming the film is as follows: a film-forming temperature of about 510° C.; (most preferably, a temperature in the range of 500 to 520° C.); a processing pressure of about 80 kPa (most preferably, a pressure in the range of 78 to 82 kPa); TEOS, $O_3$ and $N_2$ gas flow rates of 1500 mgm, 1000 sccm and 12000 sccm, respectively; and a film thickness of about 1 μm. Since the ozone TEOS film is formed by thermal CVD, the ozone TEOS film is formed onto the entire surface of the blind hole 5, which is a deep hole; thus, electric non-conductance is to be certainly attained between the semiconductor substrate and an object to be formed in this hole. Furthermore, the thickness of a tungsten film to be buried therein is to be decreased so as to decrease a warp of the wafer.

Figure 7:
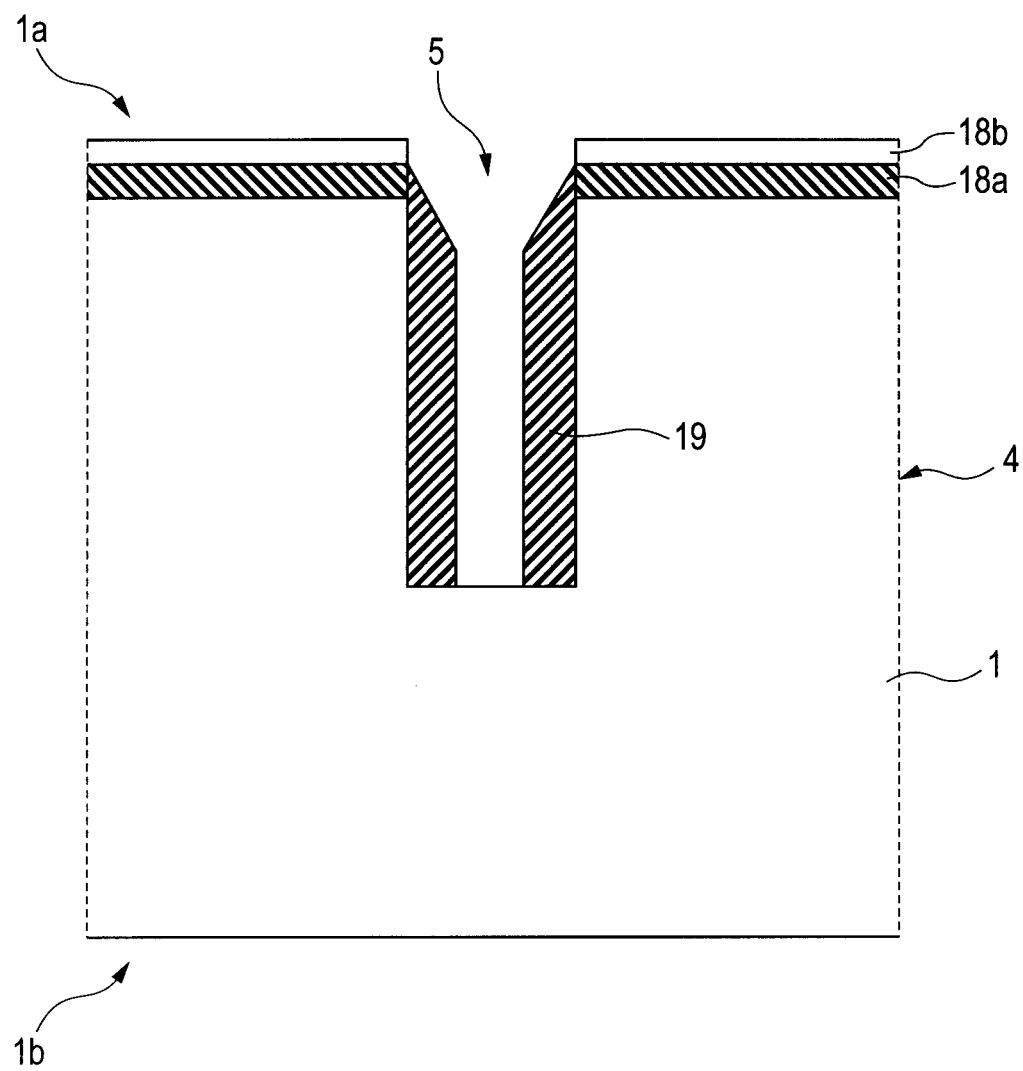
FIG. 7 illustrates the result of etching a silicon oxide film in the device of FIG. 6.

As illustrated in FIG. 7, next, the silicon oxide film 18c is etched by anisotropic dry etching to make the blind-hole-working amorphous silicon film 18b exposed.

Figure 8:
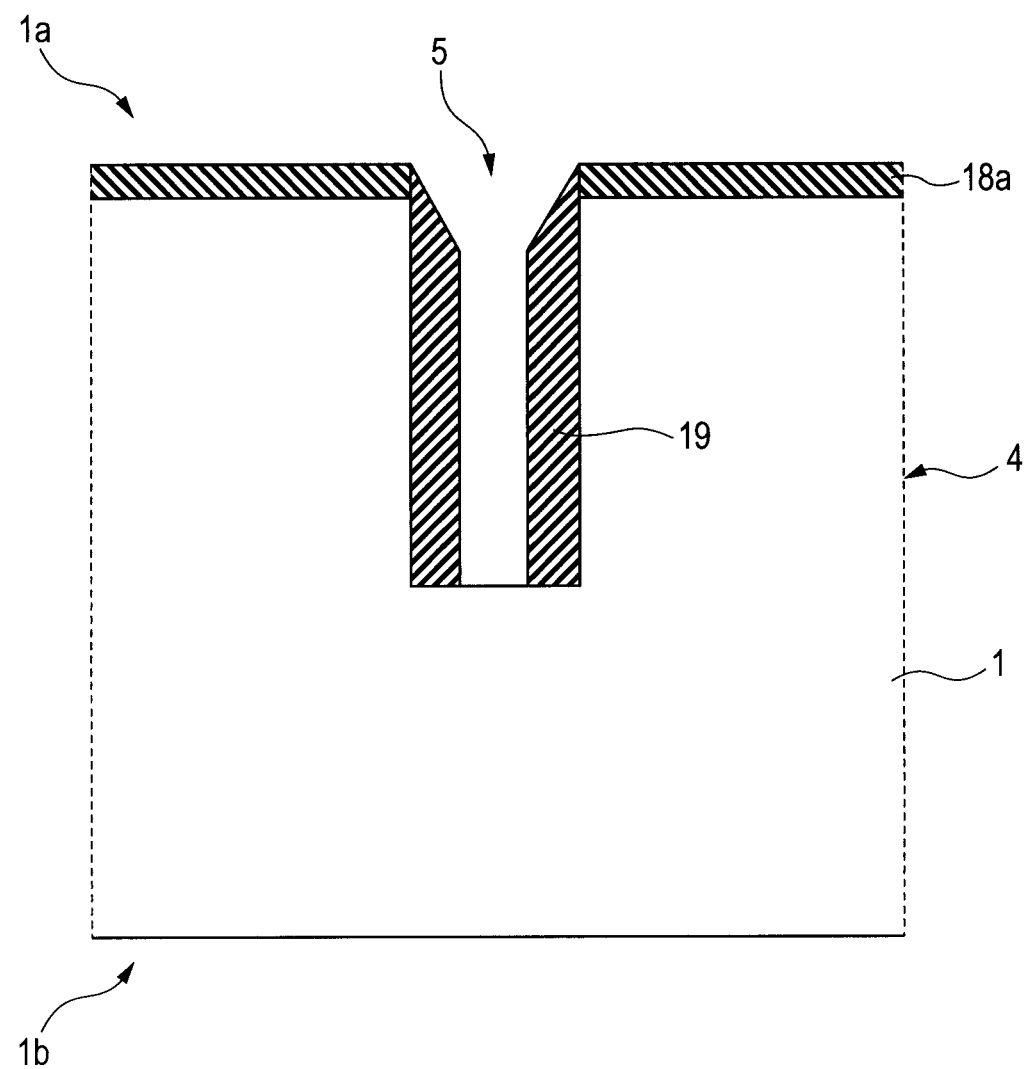
FIG. 8 illustrates the result of etching an amorphous silicon film in the device of FIG. 7.

As illustrated in FIG. 8, next, the blind-hole-working amorphous silicon film 18b at the outermost side is removed. Subsequently, silicon-oxide-film etching is carried out by anisotropic dry etching (the amount of the etching is to a degree corresponding to the thickness of the blind-hole-working silicon oxide lower film 18a), so that the blind-hole-working silicon oxide lower film 18a is removed. As will described in the sections described later, when the underlying layer of the hard mask (i.e., the layer beneath the hard mask) is not a silicon oxide based film and there is a relatively large etching selection ratio between the silicon oxide based film and the underlying layer (i.e., when the underlying film or member is made of, for example, silicon or silicon nitride), it is advisable to carry out the etching in the state such that the underlying film or member is used as a stopper (i.e., used as an etch-stop layer).

Figure 9:
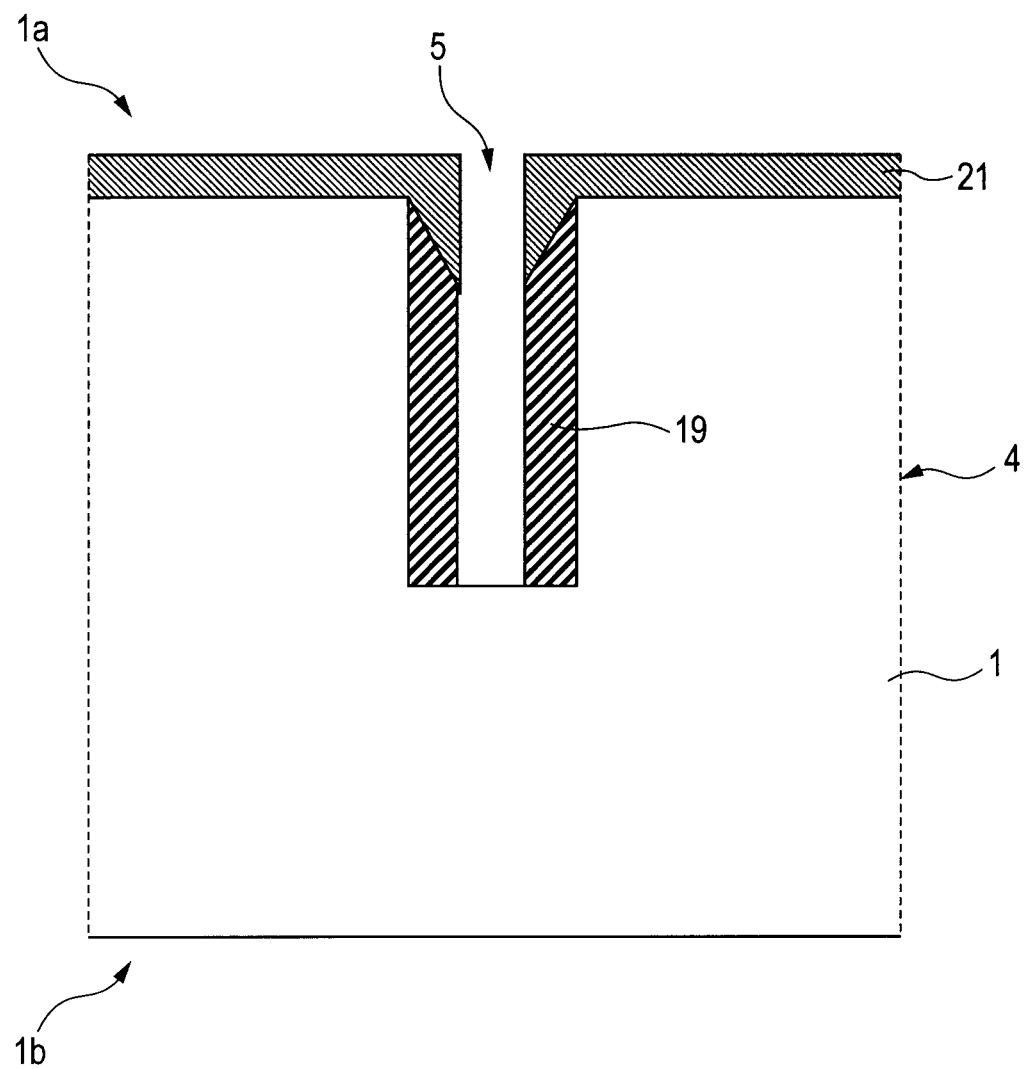
FIG. 9 illustrates the result of forming a silicon nitride film in the device of FIG. 8.

As illustrated in FIG. 9, next, a silicon nitride film 21 is formed on substantially the whole of the device surface 1a of the silicon wafer 1 by, for example, plasma CVD of a single wafer processing type. The silicon nitride film 21 is usually formed also in the vicinity of the open inlet in the blind hole 5, at least a portion of the silicon nitride film being at formed on the ozone TEOS film at an upper portion of the blind hole 5 proximate the device's front surface 1a. An example of conditions for forming the film is as follows: a film-forming temperature of about 480° C.; (most preferably, a temperature in the range of 400 to 550° C.); a processing pressure of about 270 Pa (most preferably, a pressure in the range of 200 to 350 Pa); $SH_4$, $NH_3$, Ar and $H_2$ gas flow rates of 50 sccm, 120 sccm, 2500 sccm and 750 sccm, respectively; electric powers of 120 W at 13.56 MHz and 120 W at 400 kHz that are each applied to the upper electrode; and a film thickness of about 100 nm. An example of a film-forming apparatus usable in this step is an apparatus manufactured by Applied Material, Inc., "Producer".

Figure 10:
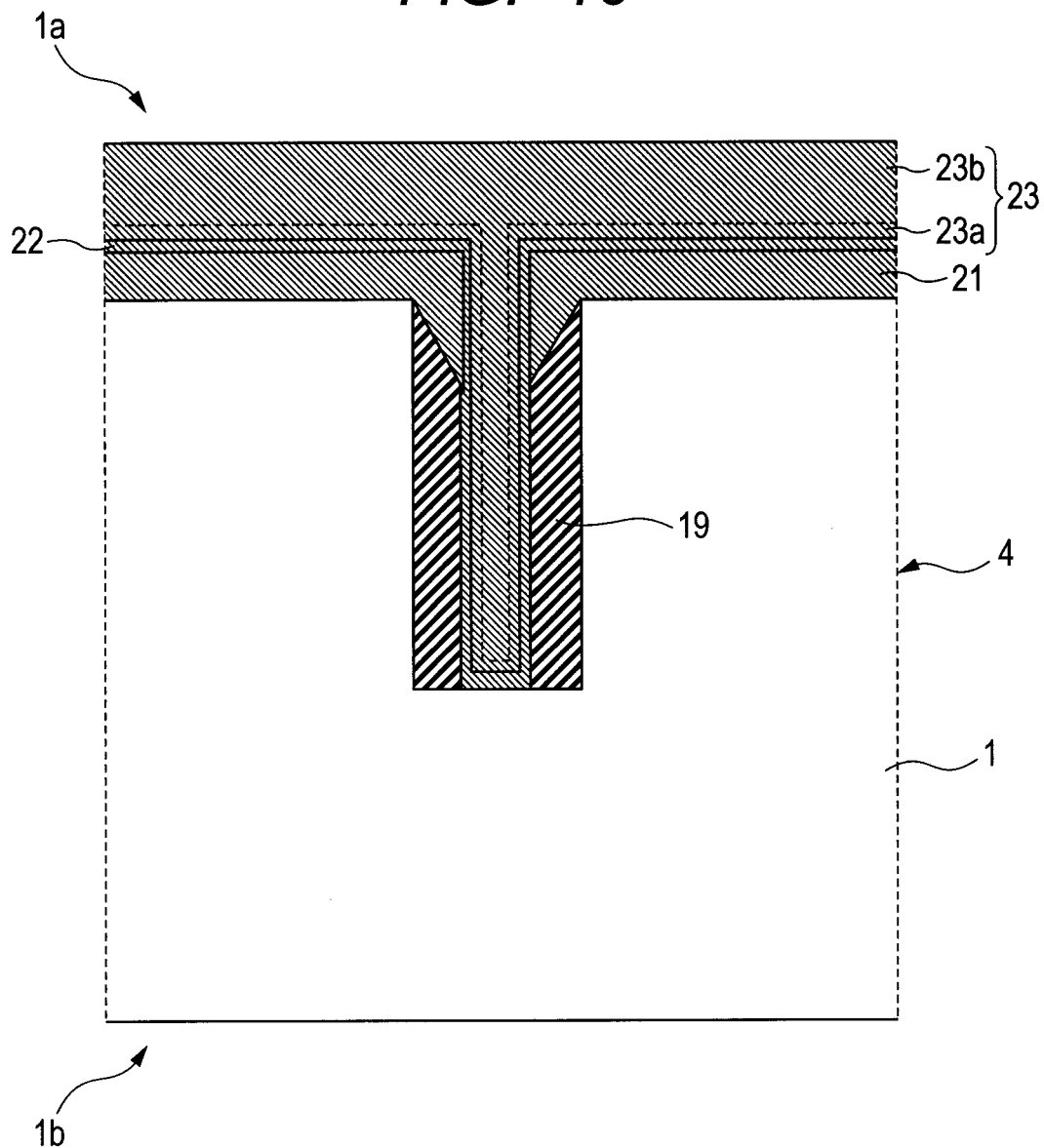
FIG. 10 illustrates the result of burying tungsten into the blind hole in the device of FIG. 9.

As illustrated in FIG. 10, next, a metal member made of tungsten or the like is formed on substantially the whole of the device surface 1a of the silicon wafer 1 and inside the blind hole 5 so as to be buried into the blind hole 5. Details thereof are successively described below.

A barrier metal film 22, for example, a TiN film is formed on substantially the whole of the device surface 1a of the silicon wafer 1 and on the whole of the inner surface of the blind hole 5 by, for example, thermal CVD (thermal low-pressure CVD) of a single wafer processing type. An example of conditions for forming the film is as follows: a film-forming temperature of about 680° C.; (most preferably, a temperature in the range of 670 to 690° C.); a processing pressure of about 40 Pa (most preferably, a pressure in the range of 30 to 50 Pa); $TiCl_4$, and $NH_3$ gas flow rates of 30 sccm, and 400 sccm, respectively; and a film thickness of about 40 nm.

Subsequently, a tungsten-nucleating film 23a is formed on substantially the whole of the device surface 1a of the silicon wafer 1 and the whole of the inner surface of the blind hole 5 by, for example, thermal CVD of a single wafer processing type. The thermal CVD is preferably ALD (atomic layer deposition) since this manner makes it possible that at the time of a subsequent formation of a buried-tungsten film, the attack of active species onto the film beneath the buried-tungsten film is effectively restrained because of a good covering performance of this manner. An example of conditions for forming the film is as follows: a film-forming temperature of about 300° C.; (most preferably, a temperature in the range of 250 to 350° C.); a processing pressure of about 650 Pa (most preferably, a pressure in the range of 500 to 800 Pa); $WF_6$, $B_2H_6$, Ar, and $H_2$ gas flow rates of 20 sccm, 150 sccm, 300 sccm, and 150 sccm, respectively; and a film thickness of about 50 nm.

A buried-tungsten film 23b, as the tungsten film referred to just above, is formed on substantially the whole of the device surface 1a of the silicon wafer 1 and inside the blind hole 5 by, for example, thermal CVD of a single wafer processing type, so as to be buried into the blind hole 5. An example of conditions for forming the film is as follows: a film-forming temperature of about 575° C.; (most preferably, a temperature in the range of 550 to 600° C.; from the viewpoint of a decrease in the warp, the performance of the burying, and others, a temperature of 500° C. or higher is essential); a processing pressure of about 10.5 kPa (most preferably, a pressure in the range of 9 to 12 kPa); $WF_6$, $H_2$ and $N_2$ gas flow rates of 400 sccm, 750 sccm, and 100 sccm, respectively; and a film thickness of about 6 nm. An example of a film-forming apparatus usable in this step is an apparatus manufactured by Tokyo Electron Ltd., "Trias".

The tungsten-nucleating film (first tungsten film) 23a having a first film thickness, and the buried-tungsten film (second tungsten film) 23b having a second film thickness form a tungsten film 23. This tungsten film 23 and the barrier metal film 22 configure the metallic member as illustrated in FIG. 3.

Figure 27:
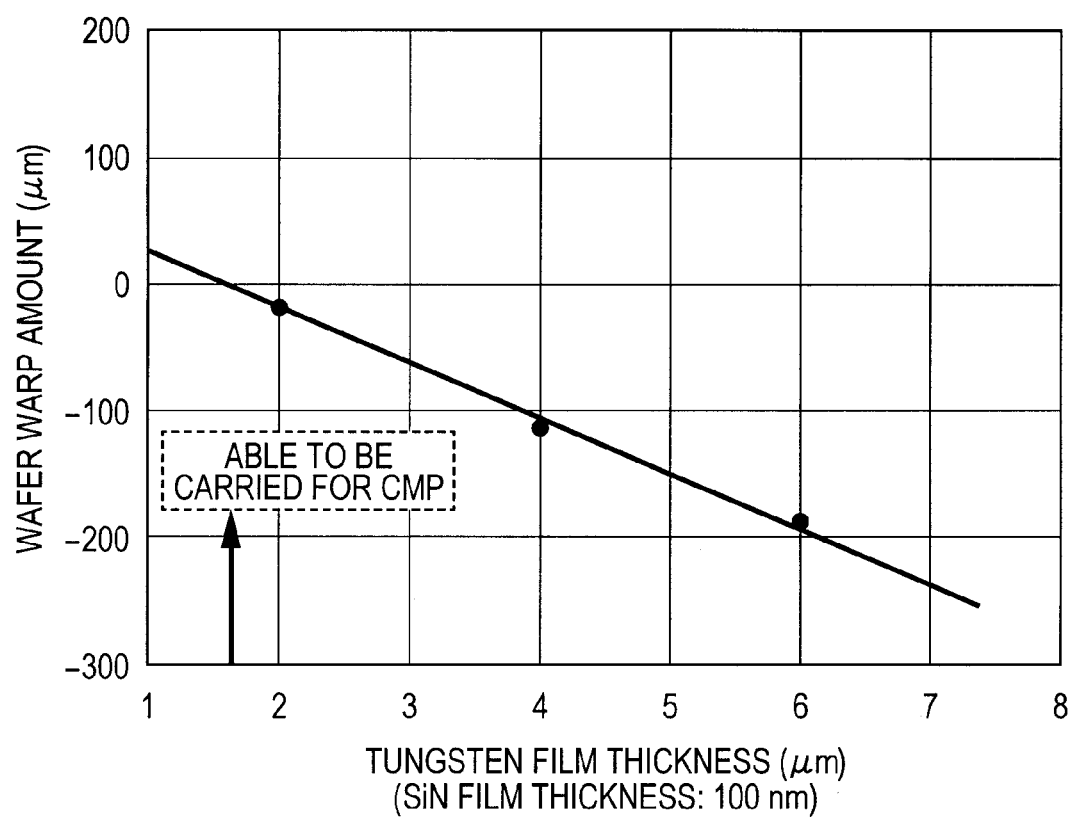
FIG. 27 is a data-plotted chart showing a relationship between the thickness of the buried-tungsten film illustrated in FIG. 10 and the warp amount of the wafer when the formation of the buried-tungsten film is finished.

FIG. 27 is a data-plotted chart showing the dependency of the warp amount of the wafer onto the thickness of the buried-tungsten film 23b in the case of forming the silicon nitride film 21 into a thickness of about 100 nm. In general, the upper limit of the absolute value of the warp amount that does not hinder a subsequent treatment such as CMP (chemical mechanical polishing) would be about 300 μm. If the thickness of the tungsten film is more than 2 μm, the wafer is usually warped to a serious degree. Thus, it appears that the wafer is not easily carried for CMP or some other treatment.

However, in the present embodiment, the titanium nitride film, which has a stress in a direction reverse to the direction of stress of the tungsten film, is formed beneath the tungsten film. Therefore, by the canceling effect thereof, the warp amount of the wafer is decreased.

Figure 11:
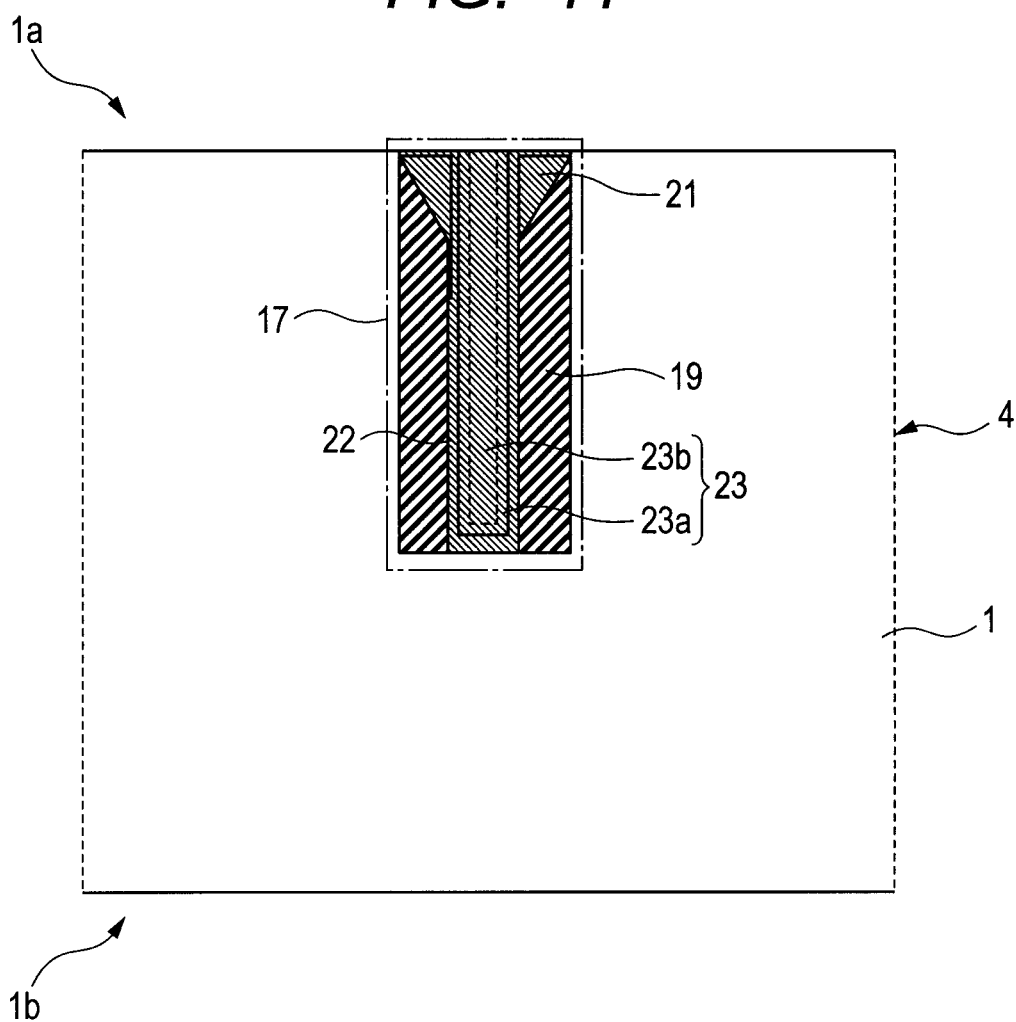
FIG. 11 illustrates the result of subjecting the front surface side of the wafer to CMP in the device of FIG. 10.

About the silicon nitride film, the following can be attained by adjusting conditions for forming this film: the film is caused to have stress for causing the edge of the wafer to warp downward (tensile stress); or the film is caused to have stress for causing the edge of the wafer to warp upward (compressive stress). In the invention, the silicon nitride film is caused to have stress in the direction reverse to the direction of stress of the tungsten film As illustrated in FIG. 11, next, a via/plug region 17 (see FIG. 3) is formed by removing the metallic member outside the blind hole 5, and the silicon nitride 21 on the surface of the wafer. Through the above-mentioned process, the workpiece reaches the state illustrated in FIG. 3.

(2) Detailed Description of the Step of the Above-Mentioned Burying into the Blind Hole (with Reference Mainly to FIGS. 12 to 15):

In this subsection, a detailed description is made about the step of burying the metal member into the blind hole 5, which has been described with reference to FIGS. 9 and 10.

Figure 12:
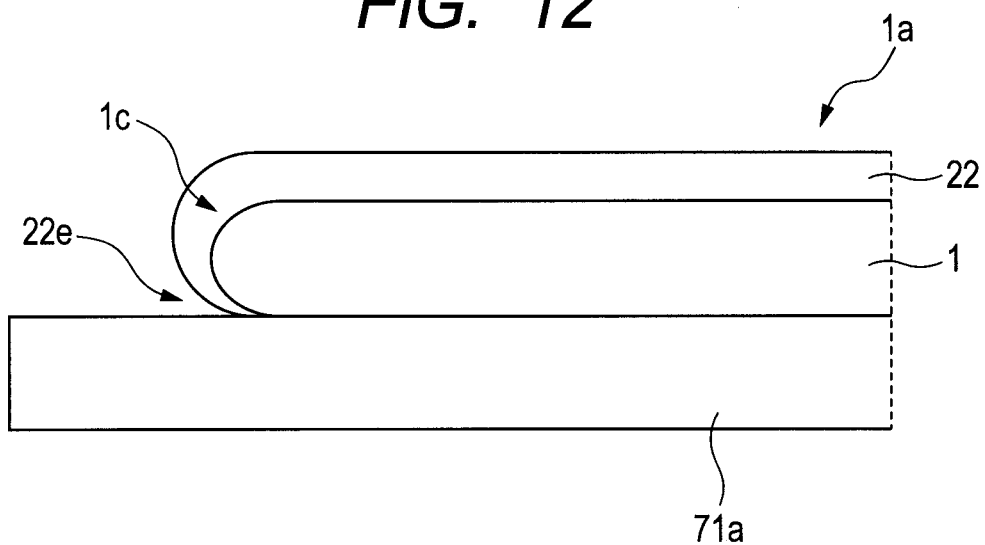
FIG. 12 is a sectional view of the vicinity of the wafer, and illustrates, in the formation of a barrier metal film in FIG. 10, a situation that the film is formed in a region including the outer edge of the wafer (referred to as the wafer-edge region just below).

The formation of the titanium nitride film 22 is first described herein. As illustrated in FIG. 12, the formation of the film on the silicon wafer 1 is attained in the state that the wafer 1 is placed on a heated susceptor (wafer stage having no chucking mechanism) 71a. In this case, the wafer is neither chucked, nor caught in any other way, and further the gas pressure for the processing is relatively low; therefore, the titanium nitride film 22 is formed on the whole of the device surface 1a of the silicon wafer 1, and an outer edge region 22e thereof extends up to the vicinity of the boundary between a bevel region 1c and the rear surface 1b.

Figure 13:
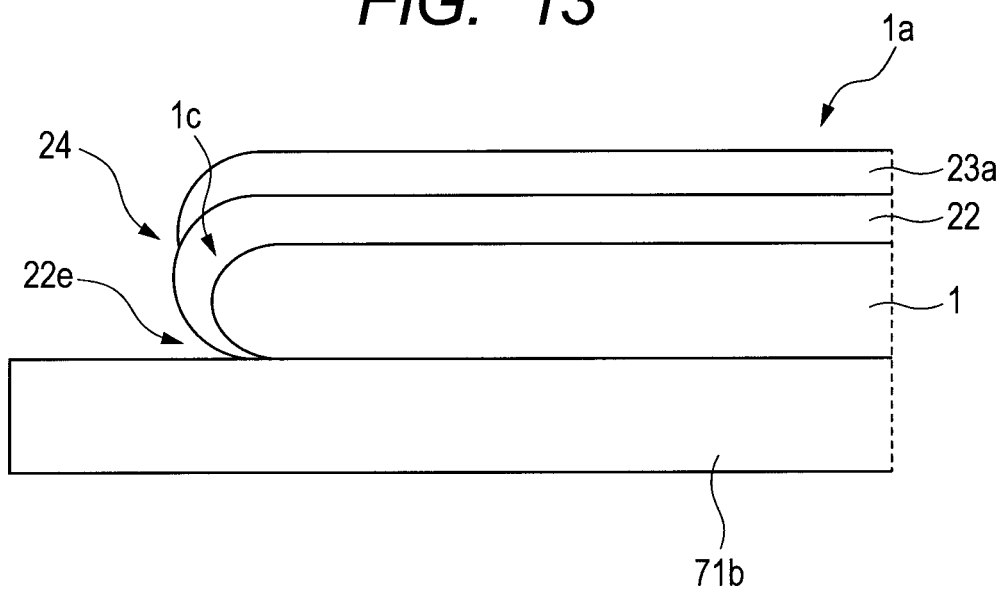
FIG. 13 is a sectional view of the vicinity of the outer edge of the wafer, and illustrates, in the formation of a tungsten-nucleating film in FIG. 10, a situation that the film is formed in the wafer-edge-region.

As illustrated in FIG. 13, the tungsten-nucleating film 23a is formed in the state that the silicon wafer 1 is placed on a wafer stage 71b having a chucking mechanism and further vacuum-sucked. In this case, the wafer is chucked and the processing gas pressure is higher than that in the case of the titanium nitride film 22; therefore, an outer edge region 24 of the tungsten-nucleating film 23a is positioned inside the outer edge region 22e of the titanium nitride film 22, that is, the region 24 is retreated from the outer edge region 22e.

Figure 14:
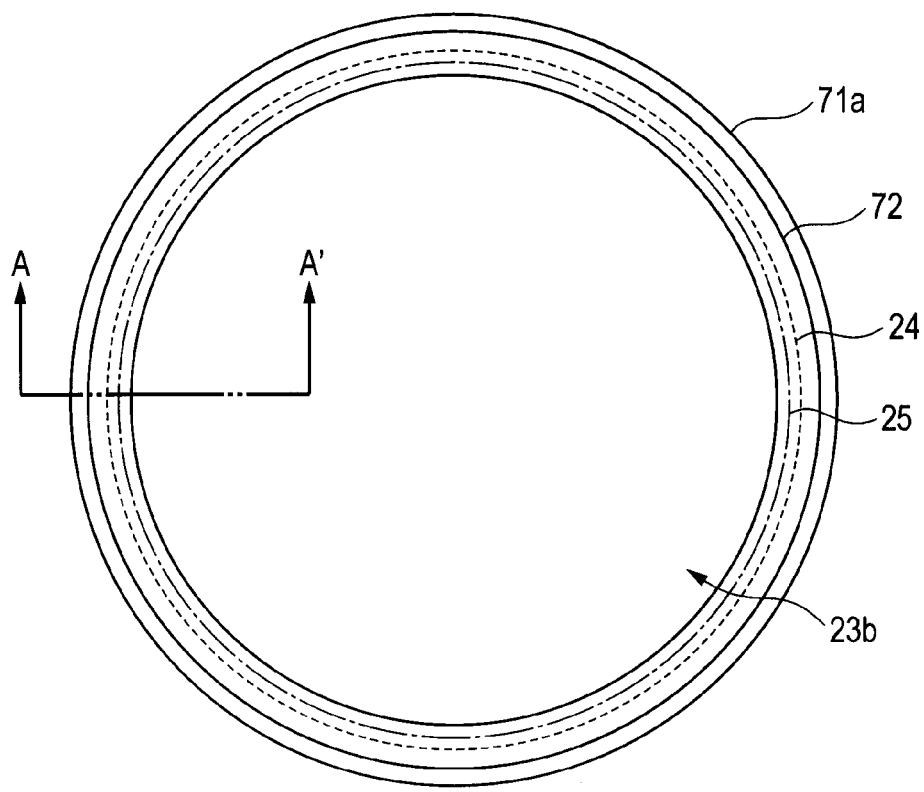
FIG. 14 is a top view of the vicinity of the wafer, and demonstrates, in the formation of a buried-tungsten film in FIG. 10, a relationship between the wafer and a peripheral device region thereof.
Figure 15:
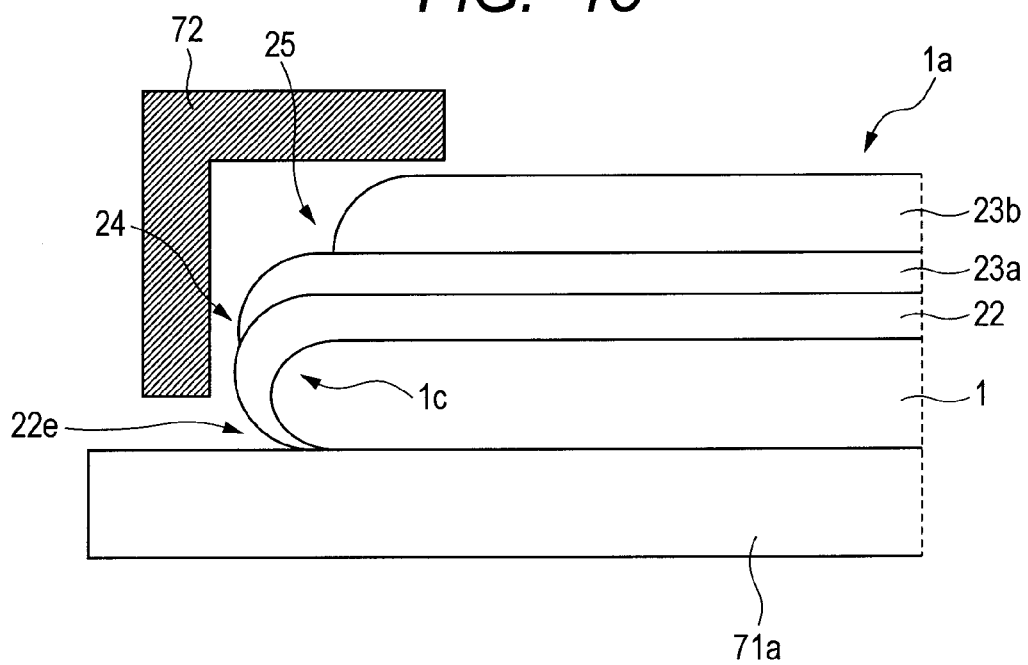
FIG. 15 is a sectional view of the vicinity of the outer edge of the wafer (cross section taken along line A-A' in FIG. 14), and illustrates, in the formation of the tungsten-nucleating film in FIG. 10, a situation that the film is formed in the wafer-edge-region.

As illustrated in FIG. 14, and FIG. 15, which is a section taken along line A-A' in FIG. 14, the buried-tungsten film 23b is formed in the state that the film 23b is placed on the heated susceptor (wafer stage having no chucking mechanism) 71a. In this case, the wafer is neither chucked, nor caught in any other way. However, the processing gas pressure is even higher than in the case of the tungsten-nucleating film 23a, and further a film-adhesion preventing ring 72 is set up; thus, an outer edge region 25 of the buried-tungsten film 23b is positioned inside the outer edge region 24 of the tungsten-nucleating film 23a, that is, the region 25 is retreated from the outer edge region 24 and also retreated from the outer edge of the outer edge region 22e of the titanium nitride film 22. In other words, the buried-tungsten film 23b is not formed at a region extending inward, to a distance over about 5 mm, from the outer circumference of the wafer (when an upper projected region of the film-adhesion preventing ring 72 has a length of about 3 mm).

This structure makes it possible to prevent, at the time of the formation of the buried-tungsten film 23b, the attack of active species, such as fluorine, onto the titanium nitride film 22 and the film beneath the film 22. Thus, the titanium nitride film 22 is not peeled, and other problems are not caused, either.

Figure 16:
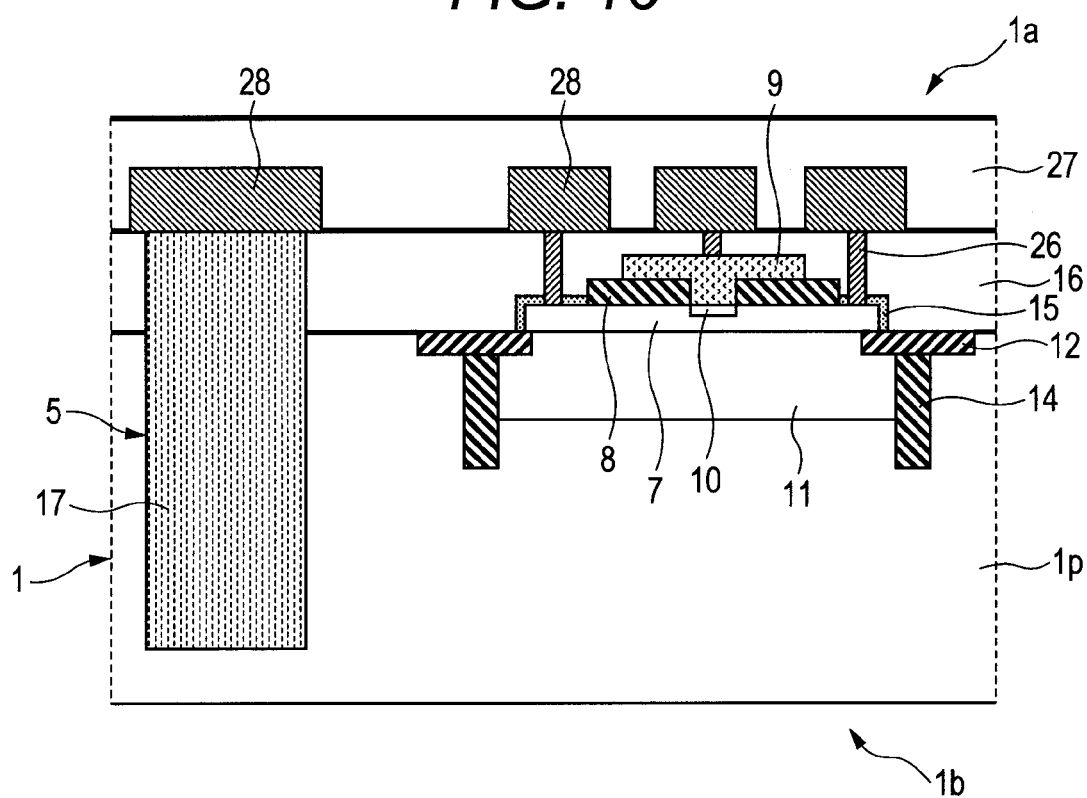
FIG. 16 is a sectional view corresponding to the sectional view illustrated in FIG. 3 and illustrating the result of forming a wiring layer (i.e., an interconnection layer).

(3) Description of Steps from the Creation of a Through Hole to Chip or Wafer-Mounting (with Reference Mainly to FIGS. 16 to 19):

As illustrated in FIG. 16, from the state illustrated in FIG. 3, a BEOL process is started. Specifically, contact holes are made open, and then tungsten plugs 26 or the like are buried thereinto. Subsequently, as an M1 interconnection, for example, an aluminum based metal interconnection 28 (including an aluminum based pad layer) is formed. A specific example of the structure of the aluminum based metal interconnection 28 is a structure comprised of a relatively thin TiN film as a lower layer, a relatively thick, main metal interconnection film made mainly of aluminum as a middle layer, and a relatively thin TiN film as an upper layer.

Subsequently, an interconnection-layer-insulating film 27 such as a final passivation layer is formed, and necessary pad openings and others are made. If necessary, it is allowable to form an interlayer dielectric to form a metal interconnection of an overlying layer. Herein, an example of an aluminum based metal interconnection has been described; however, a copper based or silver based damascene interconnection may be used.

Figure 17:
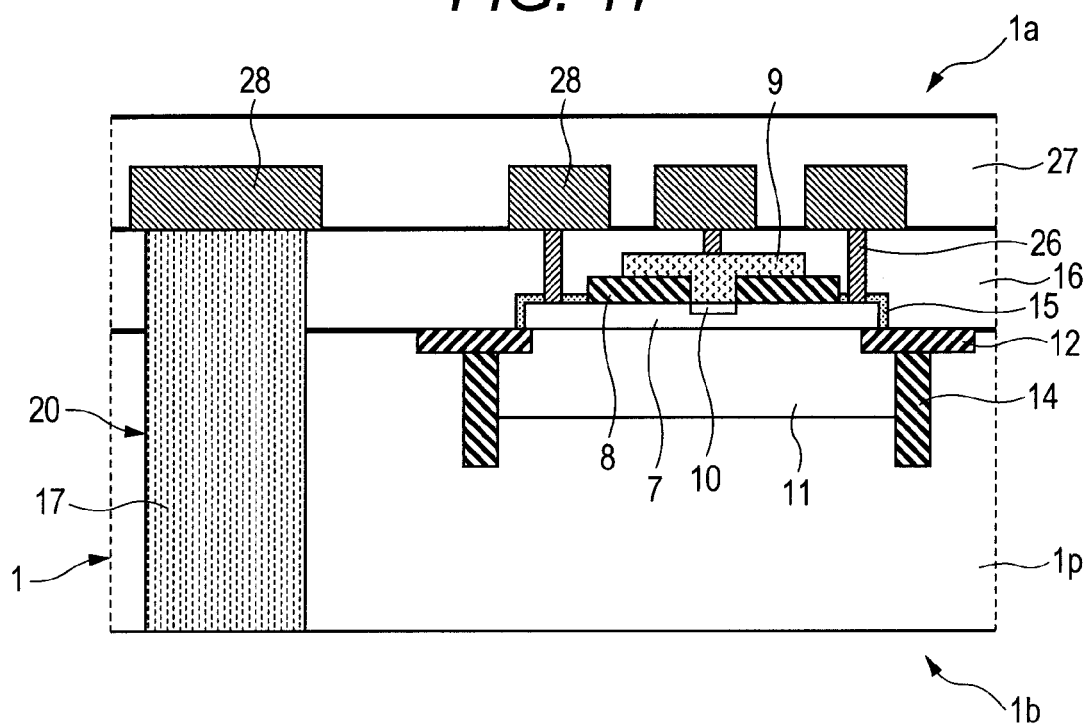
FIG. 17 illustrates the result applying a film-thinning treatment of the rear surface of the wafer of FIG. 16.
Figure 18:
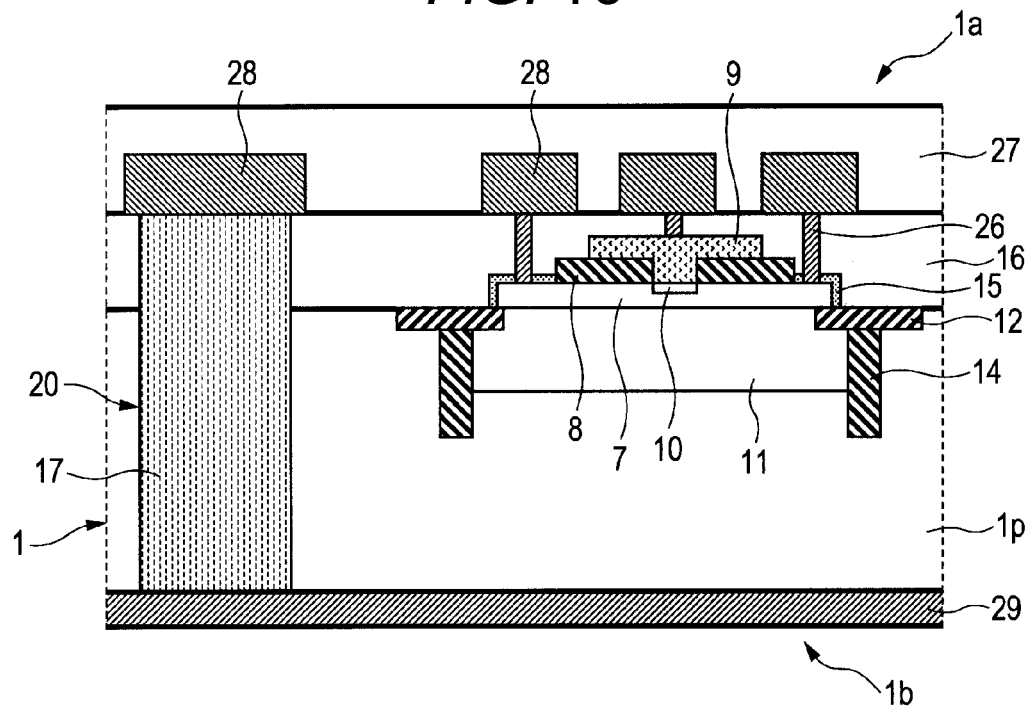
FIG. 18 illustrates the result forming a rear surface metal film on the rear surface of the wafer of FIG. 17.

As illustrated in FIG. 17, next, the rear surface 1b of the silicon wafer 1 is subjected to film-thinning treatment, thereby making the blind hole 5 into a through via 20. Examples of the film-thinning treatment include back-grinding processing, and CMP processing (or dry polishing processing) subsequent thereto. As illustrated in FIG. 18, next, a rear surface metal film 29 is formed on substantially the whole of the rear surface 1b of the silicon wafer 1 by sputtering. An example of the structure of this rear surface metal film 29 is a structure comprised of a titanium film (for example, about 100 nm in thickness), a nickel film (for example, about 200 nm in thickness), and a gold film (for example, about 100 nm in thickness), these films being arranged, in the order described herein, from the vicinity of the rear surface 1b of the silicon wafer 1 toward the front surface thereof.

Thereafter, the silicon wafer 1 is divided into individual chips 2 by dicing processing if necessary. Of course, the wafer 1 may be kept as it is when wafer-level-mounting is to be carried out.

Figure 19:
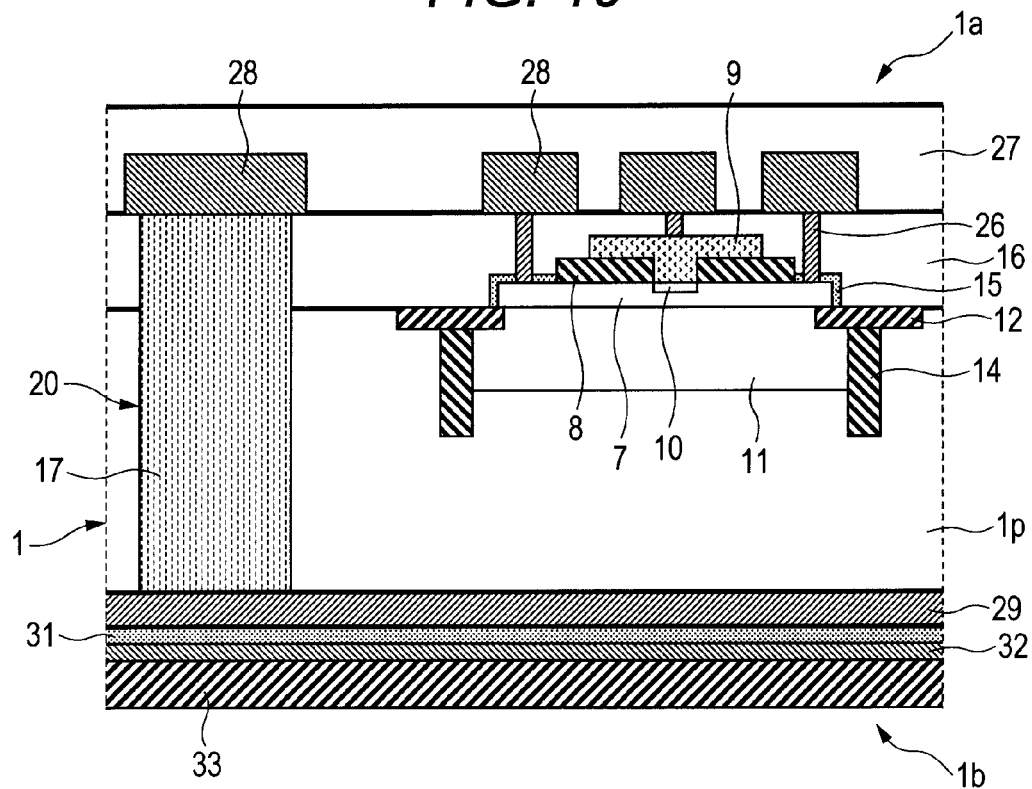
FIG. 19 illustrates the result of attaching a metal land film and then a wiring substrate to the device of FIG. 17 wafer r

As illustrated in FIG. 19, next, one of the chips 2 or the wafer 1 is mounted over a metal land film 32 (for example, a copper land film) on a wiring substrate 33 containing, for example, an organic member as a main constituent element, so as to interpose a solder layer 31, such as a lead-free solder layer, therebetween.

2. Description of a Manufacturing Method of a Semiconductor Device According to an Embodiment (Embodiment 2 Through a Via First Process) of the Invention, and Others (With Reference Mainly to FIG. 20 to FIG. 25):

In this section, a description is made about a process of forming a multi-layered structure by applying the through-electrode-forming process described with reference to FIGS. 4 to 11 to a wafer wherein a device region 6 (i.e., typical one out of all device regions) has a CMOS or CMIS structure. This manner is characterized by being applicable also to a semiconductor device wherein a nickel based silicide is used as a countermeasure against a fall in the resistance of a source, drain or gate since the process of forming a through electrode is carried out precedently to an ordinary wafer process.

In order to make the description in this section simple, an example wherein an interconnection having a monolayered structure is formed is demonstrated as a wiring process. However, in the same manner as in Section 3, a multi-layered structure may be used.

FIG. 20 to FIG. 25 are concerned with embodiment 2. With reference to these figures, the embodiment (via-first-process embodiment 2) of the semiconductor device manufacturing method of the invention, and so on are described.

Figure 20:
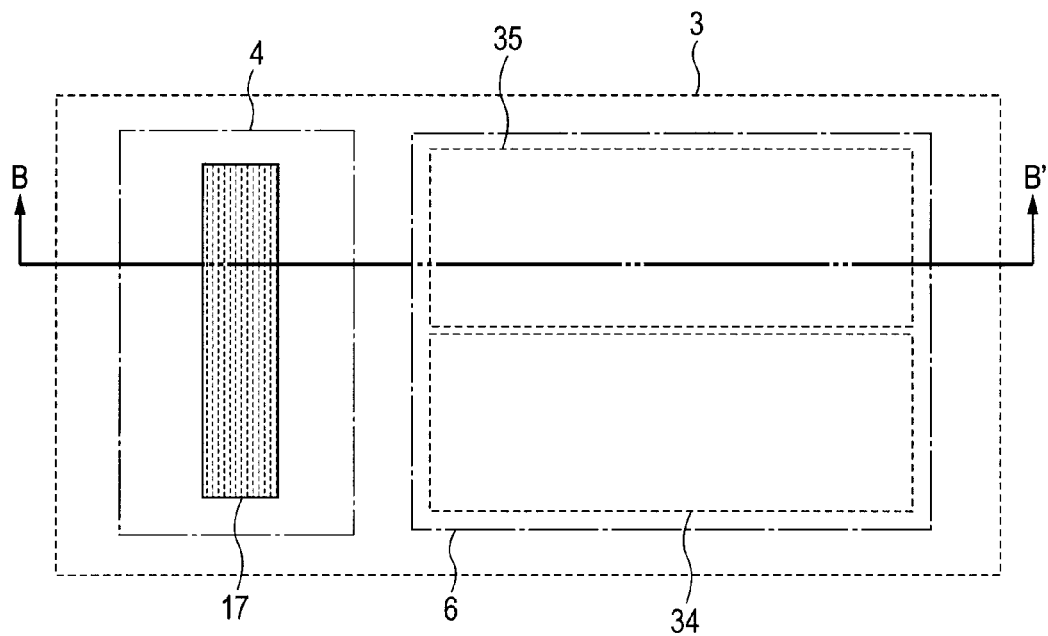
FIG. 20 is a top view of a portion (including a through-via-forming region and a silicon based CMOS device region) of a semiconductor chip region of a wafer (just after a blind hole in which a through via is to be formed is made), this region being a region to which an embodiment (embodiment 2 through a via first process) of the semiconductor device manufacturing method of the invention is applied.
Figure 21:
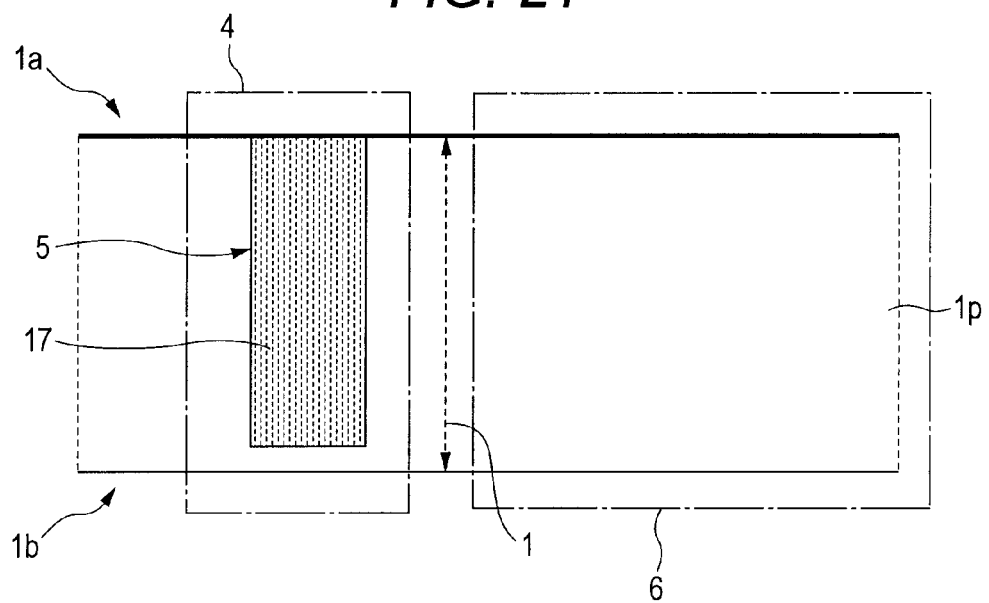
FIG. 21 is a sectional view corresponding to a sectional view taken along line B-B' in FIG. 20 when a via/plug region is formed.

FIG. 20 is a view illustrating a step of the via-first-process embodiment 2, and corresponds to FIG. 1 (in the via middle process). FIG. 21 is a sectional view taken along line B-B' in FIG. 20, and corresponds to FIG. 3 (in the via middle process). In the via first process, basically in the state that a component is not formed at all in a device region (CMOS-FET- or CMISFET-forming region) 6 (i.e., the state that a p-type monocrystal silicon substrate region 1p is kept without being processed), a via/plug region 17 is formed. Thus, at this time, correctly, an N channel device region 34 and a P channel device region 35 (in FIG. 20) are regions which later will become an N channel device region, and a P channel device region, respectively.

Figure 22:
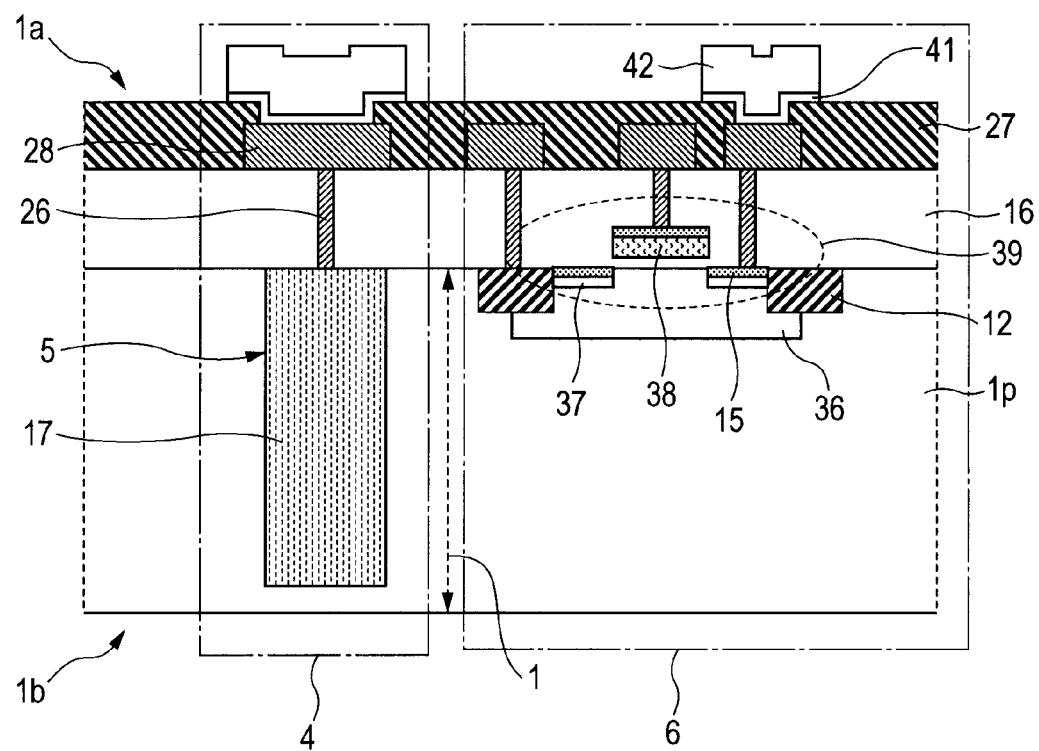
FIG. 22 illustrates the result of forming front surface copper bump in the via-region and the device region in wafer of FIG. 21.

As illustrated in FIG. 22, subsequently to the state illustrated in FIG. 21, a wafer process (FEOL process) is carried out, using a silicon wafer 1 in the state illustrated in FIG. 21 as an ordinary starting wafer for the wafer process, thereby forming, for example, P channel MISFETs, any one of which is a P channel MISFET 39 and configures a CMOS device in accordance with a nickel based silicide process. Specifically, in a surface region of a device surface 1a of the p-type monocrystal silicon substrate region 1p, an N well region 36 surrounded by an STI region 12 lies; in the surface region, a source/drain region 37 is formed; and further a gate electrode 38 (for example, a polysilicon gate) is formed over the device surface 1a of the p-type monocrystal silicon substrate region 1p to interpose a gate insulating film therebetween.

Subsequently, a premetal insulating film 16 as described above is formed on the device surface 1a of the monocrystal silicon substrate region 1p. Next, a contact hole is made in the premetal insulating film 16, and then a tungsten plug 26 is buried thereinto. Next, for example, an aluminum based metal interconnection 28 (including an aluminum based pad layer) is formed, as an M1 interconnection (or a pad overall interconnection), on the premetal insulating film 16 in the same manner as described above. A specific example of the structure of the aluminum based metal interconnection 28 is a structure comprised of a relatively thin TiN film as a lower layer, a relatively thick, main metal interconnection film made mainly of aluminum as a middle layer, and a relatively thin TiN film as an upper layer.

Thereafter, an interconnection-layer-insulating film 27 such as a final passivation layer is formed, and necessary pad openings and others are made. As will be described in detail with reference to FIG. 26, it is allowable as the need arises to form an interlayer dielectric to form a metal interconnection of an overlying layer. Herein, an example of aluminum based metal wiring (interconnection) has been described; however, copper based or silver based damascene wiring may be used.

Next, for example, a chromium film 41 (for example, about 175 nm in thickness) is formed, as an UBM (under bump metal film) on substantially the whole of the device surface 1a of the monocrystal silicon substrate region 1p by sputtering or the like. Subsequently, a copper seed film (for example, about 150 nm in thickness) is formed on the whole of the chromium film 41 by sputtering or the like. Thereafter, by electroplating using a pattern made of a resist film, a relatively thick surface copper bump 42 (for example, about 5 μm in thickness) is formed. Subsequently, the resist film that has been turned unnecessary is removed, and then a mixed solution of sulfuric acid and hydrogen peroxide water is used to perform wet etching-back, thereby removing the copper seed film. Furthermore, a mixed solution of potassium permanganate, and sodium metasilicate or some other material is used to remove the chromium film 41 in a self-alignment manner. As a result, a bump-shape illustrated in FIG. 22 is obtained.

Figure 23:
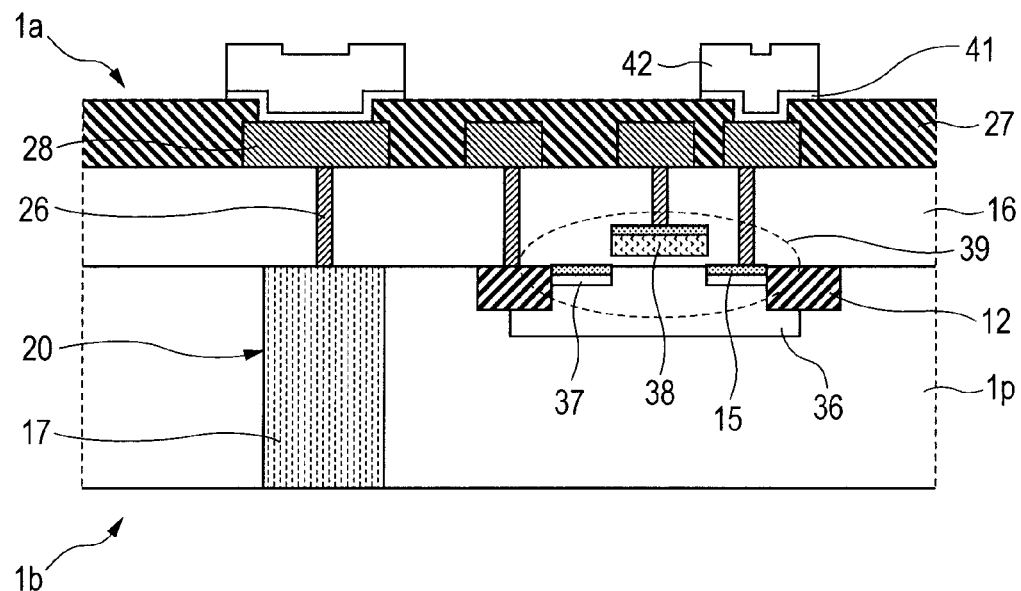
FIG. 23 illustrates the result of film-thinning treatment on the rear surface of the wafer of FIG. 22.

As illustrated in FIG. 23, next, the rear surface 1b of the silicon wafer 1 is subjected to film-thinning treatment, thereby making the blind hole 5 into a through via 20. Examples of the film-thinning treatment include back-grinding processing, and CMP processing (or dry polishing processing) subsequent thereto.

Figure 24:
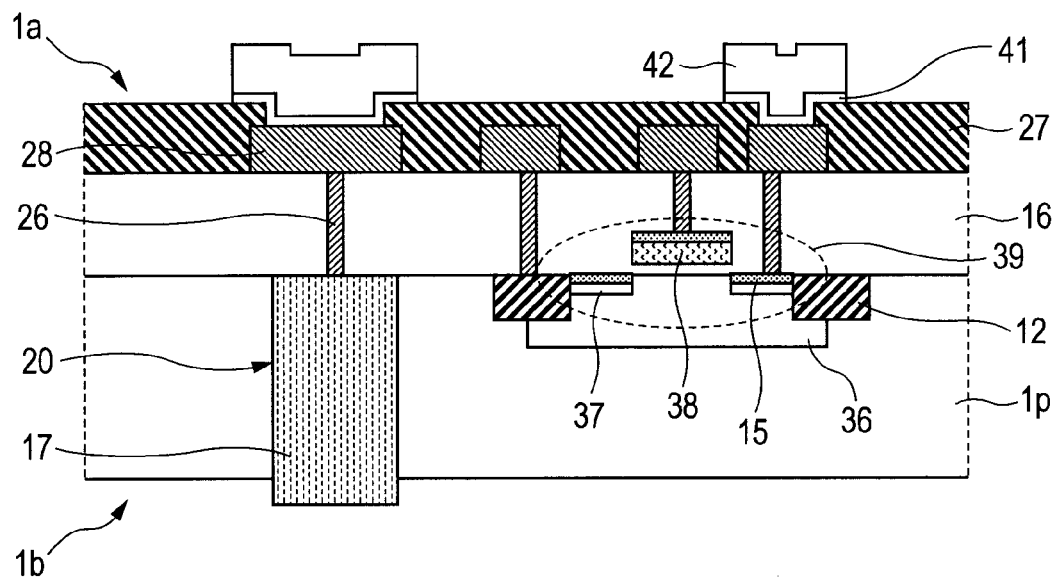
FIG. 24 illustrates the result of silicon etching-back of the rear surface of the wafer of FIG. 23.

As illustrated in FIG. 24, next, the rear surface 1b of the silicon wafer 1 is subjected to silicon etching-back treatment, thereby resulting in the lower surface of the via/plug region 17 protruding slightly.

Figure 25:
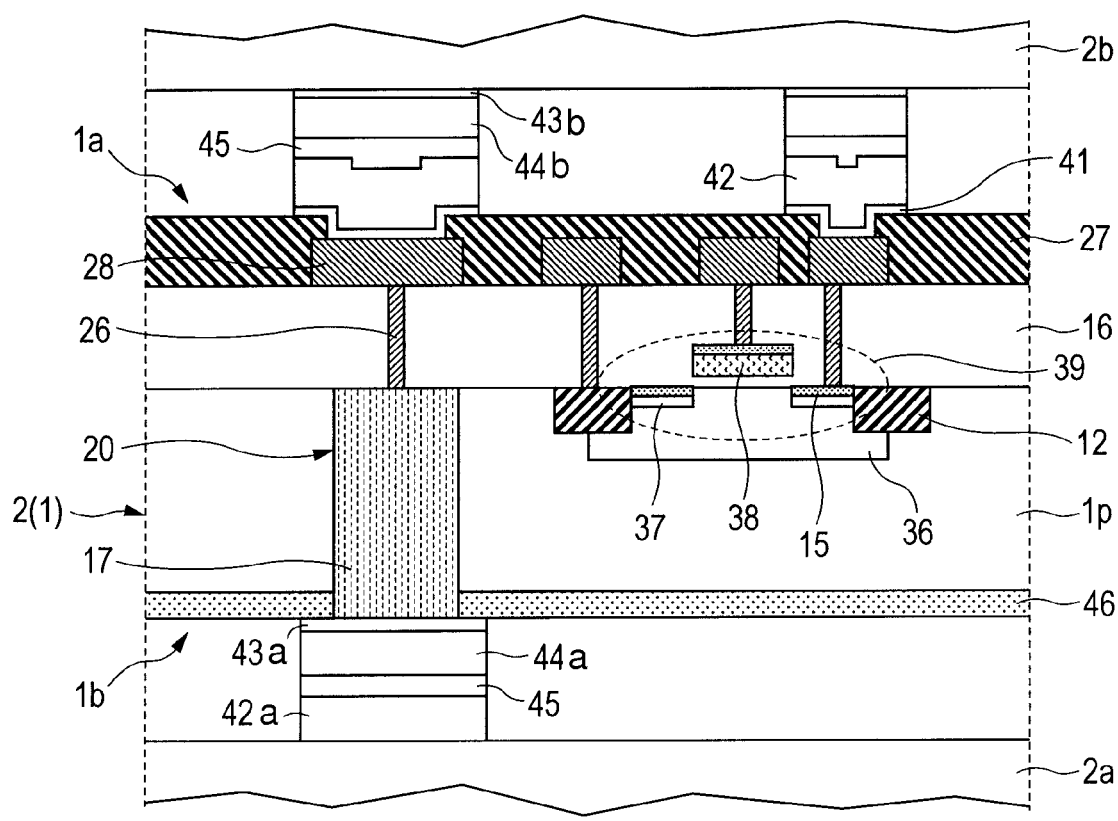
FIG. 25 illustrates the result of lamination mounting of chips from the wafer of FIG. 24.

As illustrated in FIG. 25, next, a heat-resistant organic polymer film (rear surface organic insulating film) 46, for example, a BCB (benzocyclobutane) film is formed on the whole of the rear surface 1b of the silicon wafer 1 by painting. This film is subjected to curing treatment, and then made flat by CMP using a slurry containing alumina grains or the like, or some other method, so as to make the lower surface of the via/plug region 17 exposed. Subsequently, in a manner equivalent to the manner of forming the front surface copper bump 42, a rear surface UBM layer 43a and a rear surface copper bump 44a are formed.

Thereafter, the silicon wafer 1 is divided into individual chips 2 by dicing treatment or some other treatment if necessary. Of course, the wafer 1 may be kept as it is when wafer-level-mounting is to be carried out.

Subsequently, the rear surface copper bump 44a and the front surface copper bump 42 are coupled to a front surface copper bump 42a of a chip or wafer 2a arranged below and a rear surface copper bump 44b (with associated UBM layer 43b) of a chip or wafer 2b arranged above, respectively, through respective coupling layers, for example, copper/tin eutectic crystal layers 45.

3. Description of a Manufacturing Method of a Semiconductor Device According to an Embodiment (Embodiment 3 Through a Via Last Process) of the Invention, and Others (With Reference Mainly to FIG. 26):

In this section, a description is made about a process of forming a multi-layered structure by applying the through-electrode-forming process described with reference to FIGS. 4 to 11 to a wafer wherein a device region 6 (i.e., typical one out of all device regions) has a CMOS or CMIS structure.

Figure 26:
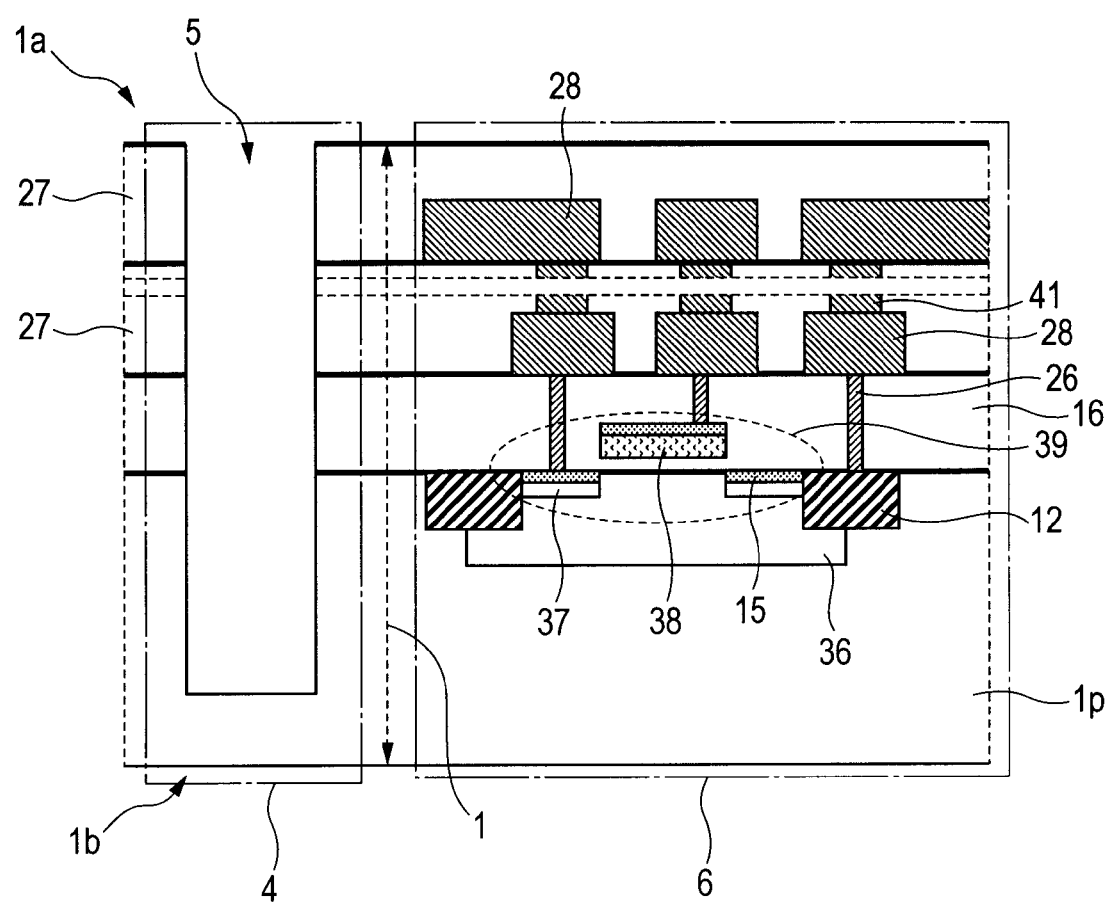
FIG. 26 is a sectional view of a portion (including a through-via-forming region, and a P channel device region of a silicon based CMOS device region) of a semiconductor chip region of a wafer (just after a blind hole in which a through via is to be formed is made), this region corresponding to the cross section taken along line B-B' in FIG. 20, and being a region to which an embodiment (embodiment 3 through a via last process) of the semiconductor device manufacturing method of the invention is applied.

FIG. 26 is a sectional view of a portion of a semiconductor chip region of a target semiconductor device of an embodiment (embodiment 3 through a via last process) of the semiconductor device manufacturing method of the present invention; the semiconductor chip region corresponds to the section taken along line B-B' in FIG. 20 just after the creation of the blind hole for making the through via, and the portion is a portion including a through-via-making region and a p channel device region of a silicon based CMOS device region. With reference to this figure, the semiconductor device manufacturing method of the embodiment (via-last-process embodiment 3) of the invention, and so on are described.

As illustrated in FIG. 26, in the via last process, at a timing later than the timing in the via middle process, that is, after an ordinary BEOL process (wiring process) is finished or is substantially finished, the step of forming a through via is started, specifically, the formation of a blind hole 5 is started. A structure illustrated in FIG. 26 is substantially the same as in FIG. 22. In this case, however, a surface silicide film 15 is made of a silicide other than nickel based silicide, for example, cobalt based, titanium based, or tungsten based silicide.

Steps after the step illustrated in FIG. 26 are substantially the same as steps described with reference to FIGS. 4 to 11, and FIGS. 16, 17, 24 and 25.

4. Summary:

Hereinbefore, the invention made by the inventors has been specifically described by way of embodiments thereof. However, the invention is not limited thereto; thus, it is needless to say that the embodiments may be changed or modified into various forms within the scope which does not depart from the subject matter thereof.

In the embodiments, for example, as the interconnection layer thereof, an interconnection layer wherein an ordinary aluminum based interconnection (non-buried interconnection) is used has been mainly demonstrated. However, the interconnection layer usable in the invention is not limited thereto. Thus, it is needless to say that the present invention is applicable to the manufacture of a semiconductor device using a copper based or silver based damascene interconnection (buried interconnection), or using both of an ordinary aluminum based interconnection and a damascene interconnection.

What is claimed is:

1. A manufacturing method of a semiconductor device, comprising the steps of:
   (a) forming a blind hole in a silicon wafer from a device main surface thereof toward the rear surface thereof;
   (b) forming a silicon nitride film over the device main surface of the silicon wafer;
   (c) forming, by CVD, a barrier metal film over:
      the silicon nitride film which is over the device main surface,
      a periphery of the silicon wafer at the device main surface side, and
      an inner surface of the blind hole;
   (d) forming, by CVD, a tungsten film over:
      the barrier metal film which is over the device main surface, except in the vicinity of the outer edge of the barrier metal film, and
      the barrier metal film inside the blind hole so as to be buried into the blind hole;
   (e) removing the barrier metal film and the tungsten film outside the blind hole at the device main surface side of the silicon wafer; and
   (f) subjecting the rear surface side of the silicon wafer to film-thinning treatment, thereby making the blind hole into a through via;
   wherein the barrier metal film is exposed in the periphery of the silicon wafer at the end of step (d).

2. The manufacturing method according to claim 1, further comprising, between steps (a) and (b), a step of:
   forming, by thermal CVD, an ozone TEOS film over the device main surface of the silicon wafer and the inner surface of the blind hole.

3. The manufacturing method according to claim 2, wherein the silicon nitride film is formed by plasma CVD.

4. The manufacturing method according to claim 1, wherein the silicon nitride film is formed by plasma CVD.

5. The manufacturing method according to claim 1, wherein step (d) comprises the substeps of:
   (d1) forming a first tungsten film having a first thickness over:
      the barrier metal film which is over the device main surface, and
      the barrier metal film inside the blind hole; and
   (d2) after the substep (d1), forming a second tungsten film having a second thickness larger than the first thickness over the first tungsten film,
   wherein a vicinity of the outer edge of the first tungsten film is exposed at the end of substep (d2).

6. The manufacturing method according to claim 5, wherein the substep (d1) is performed by atomic layer deposition (ALD).

7. The manufacturing method according to claim 6, wherein the temperature for processing the wafer in substep (d2) is between 550° C. and 600° C.

8. The manufacturing method according to claim 7, wherein among the individual processing gas pressures in step (c), and substeps (d1) and (d2), the gas pressure in the step (c) is the lowest and the gas pressure in the substep (d2) is the highest.

9. The manufacturing method according to claim 8, wherein steps (a) to (f) are performed before a device is formed in a device region at the device main surface side of the wafer.

10. The manufacturing method according to claim 8, wherein steps (a) to (f) are performed after a premetal insulating film is formed in a device region at the device main surface side of the wafer, and before the wafer is caused to undergo a BEOL process.

11. The manufacturing method of a semiconductor device according to claim 1, wherein a direction of stress of the silicon nitride film is a direction in which stress of the tungsten film is cancelled.

12. The manufacturing method according to claim 1, further comprising, between the steps (e) and (f), a step of:
   removing the silicon nitride film outside the blind hole at the device main surface side of the wafer.

* * * * *